United States Patent
Sasaki

(10) Patent No.: US 7,906,440 B2
(45) Date of Patent: Mar. 15, 2011

(54) SEMICONDUCTOR DEVICE MANUFACTURING METHOD AND PLASMA OXIDATION METHOD

(75) Inventor: Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 731 days.

(21) Appl. No.: 11/815,266

(22) PCT Filed: Jan. 24, 2006

(86) PCT No.: PCT/JP2006/301011
§ 371 (c)(1),
(2), (4) Date: Aug. 1, 2007

(87) PCT Pub. No.: WO2006/082730
PCT Pub. Date: Aug. 10, 2006

(65) Prior Publication Data
US 2008/0146041 A1   Jun. 19, 2008

(30) Foreign Application Priority Data
Feb. 1, 2005   (JP) .................................. 2005-024894

(51) Int. Cl.
*H01L 21/31* (2006.01)
(52) U.S. Cl. ......... 438/772; 438/197; 438/769; 438/778
(58) Field of Classification Search .................. 438/197, 438/768, 769, 772, 770–771, 773–779
See application file for complete search history.

(56) References Cited

U.S. PATENT DOCUMENTS
4,305,200 A * 12/1981 Fu et al. ........................ 438/618

FOREIGN PATENT DOCUMENTS
| JP | 8 102534 | 4/1996 |
| JP | 2000 269496 | 9/2000 |
| JP | 2000 332245 | 11/2000 |
| JP | 2001 156059 | 6/2001 |
| WO | 02 058130 | 7/2002 |
| WO | 2004 073073 | 8/2004 |

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

A semiconductor device manufacturing method includes forming a gate insulating film on a semiconductor substrate; forming, on the gate insulating film, a multilayered structure including at least a polysilicon layer and a metal layer containing a refractory metal; forming a gate electrode by etching the multilayered structure; and performing a plasma process by a plasma processing apparatus, which is configured to supply microwaves into a process chamber from a planar antenna including a plurality of slots and thereby to generate plasma, at a process pressure of 133.3 to 1,333 Pa and a process temperature of 250 to 800° C. by using a process gas containing at least hydrogen gas and oxygen gas, thereby selectively oxidizing the polysilicon layer in the gate electrode.

10 Claims, 16 Drawing Sheets

SEMICONDUCTOR DEVICE MANUFACTURING METHOD AND PLASMA OXIDATION METHOD

TECHNICAL FIELD

The present invention relates to a semiconductor device manufacturing method and plasma oxidation method including a step of processing a semiconductor substrate by use of plasma.

BACKGROUND ART

Recently, the design rules of semiconductor elements forming LSIs are still more miniaturized in order to meet demands for a high integration degree and high speed of LSIs. Accordingly, a demand has arisen for decreasing the resistance of the gate electrode of a transistor used in a DRAM or flash memory. Although polysilicon is conventionally used as the gate electrode, polysilicon has the drawback that the sheet resistance is high. Therefore, as a metal having a low resistance value, high adhesion to a silicon oxide film and silicon itself, and high processability, it has been proposed to stack a refractory metal such as tungsten or its silicide on a polysilicon layer. More specifically, tungsten polycide (a stacked film of WSi/poly-Si) and a tungsten poly-metal gate (a stacked structure of W/WN/poly-Si) are attracting attention. Note that WN of the tungsten poly-metal gate is a barrier layer (diffusion barrier layer) for preventing the reaction between tungsten and polysilicon.

The gate of a transistor is generally formed in the order of a well, gate insulating film, and gate electrode. Etching is performed to form the gate electrode. Since this etching exposes the side surfaces of a polysilicon layer in the gate electrode, electric field concentration occurs in this exposed region when a voltage is applied to the gate electrode, and this causes a product defect such as an increase in leakage current. Therefore, it is necessary to perform an oxidation process of forming insulating films by oxidizing the exposed regions of polysilicon in the gate electrode.

As a method of the oxidation process of forming insulating films on the exposed regions of the polysilicon layer on the side surfaces of the gate electrode, a method that performs thermal oxidation at a high temperature of 800° C. or more is generally used (e.g., Patent Document 1). When thermal oxidation is performed, however, a phenomenon (bird's beak) in which the edges of the polysilicon layer excessively oxidize occurs, and this makes the film thickness of the gate insulating film less uniform in the direction of the plane, and makes it difficult to meet the ultra-miniaturization design rules.

Also, tungsten and tungsten silicide used to decrease the sheet resistance of the gate electrode are rapidly oxidized if the temperatures exceed about 300° C. and about 400° C., respectively, and this poses the problem that a metal layer is oxidized if thermal oxidation is performed at a high temperature exceeding 800° C.

[Patent Document 1]

Jpn. Pat. Appln. KOKAI Publication No. 2000-269496 (the scope of claims and the like)

DISCLOSURE OF INVENTION

To solve the problems of thermal oxidation as described above, it is being studied to apply, to the oxidation process of tungsten polycide or a tungsten poly-metal gate, a plasma processing apparatus using an RLSA (Radial Line Slot Antenna) microwave plasma and capable of a low temperature process using plasma having a high density and low electron temperature.

Oxidation using the RLSA microwave plasma can suppress the oxidation of the metal layer, selectively oxidize only the polysilicon layer, and also suppress the formation of a bird's beak. When oxidation is performed using the RLSA microwave plasma, however, the oxide film thickness sometimes varies, so it is still necessary to make this oxide film thickness uniform.

Also, oxidation using the RLSA microwave plasma has another problem that since bird's beak formation is excessively suppressed, the edge portion of the polysilicon layer hardly changes its shape and remains as an acute portion, and an electric field concentrates to this acute portion to increase the leakage current.

It is, therefore, an object of the present invention to form a uniform oxide film having a small film thickness difference on a polysilicon layer on a semiconductor wafer by using the RLSA microwave plasma. It is another object of the present invention to round the oxide film on the edge portion of the polysilicon layer by appropriately increasing the oxide film thickness on this portion while suppressing excess bird's beak formation.

To solve the problems described above, according to a first aspect of the present invention, there is provided a semiconductor device manufacturing method comprising performing a plasma process on a multilayered structure including at least a polysilicon layer and a metal layer containing a refractory metal by a plasma processing apparatus, which is configured to supply microwaves into a process chamber from a planar antenna including a plurality of slots and thereby to generate plasma, at a process pressure of 133.3 to 1,333 Pa and a process temperature of 250 to 800° C. by using a process gas containing at least hydrogen gas and oxygen gas, thereby oxidizing the polysilicon layer.

According to a second aspect of the present invention, there is provided a semiconductor device manufacturing method comprising:

forming a gate insulating film on a semiconductor substrate;

forming, on the gate insulating film, a multilayered structure including at least a polysilicon layer and a metal layer containing a refractory metal;

forming a gate electrode by etching the multilayered structure; and performing a plasma process by a plasma processing apparatus, which is configured to supply microwaves into a process chamber from a planar antenna including a plurality of slots and thereby to generate plasma, at a process pressure of 133.3 to 1,333 Pa and a process temperature of 250 to 800° C. by using a process gas containing at least hydrogen gas and oxygen gas, thereby selectively oxidizing the polysilicon layer in the gate electrode.

According to a third aspect of the present invention, there is provided a semiconductor device manufacturing method comprising performing a plasma process on a multilayered structure including at least a polysilicon layer and a metal layer containing a refractory metal by a plasma processing apparatus, which is configured to supply microwaves into a process chamber from a planar antenna including a plurality of slots and thereby to generate plasma, at a process pressure of 133.3 to 1,333 Pa and a process temperature of 250 to 800° C., while flow rates of hydrogen gas, oxygen gas, and a rare gas in a process gas are respectively 10 to 500, 10 to 500, and 0 to 2,000 mL/min, thereby oxidizing the polysilicon layer.

According to a fourth aspect of the present invention, there is provided a semiconductor device manufacturing method comprising:

forming a gate insulating film on a semiconductor substrate;

forming, on the gate insulating film, a multilayered structure including at least a polysilicon layer and a metal layer containing a refractory metal;

forming a gate electrode by etching the multilayered structure; and performing a plasma process by a plasma processing apparatus, which is configured to supply microwaves into a process chamber from a planar antenna including a plurality of slots and thereby to generate plasma, at a process pressure of 133.3 to 1,333 Pa and a process temperature of 250 to 800° C., while flow rates of hydrogen gas, oxygen gas, and a rare gas in a process gas are respectively 10 to 500, 10 to 500, and 0 to 2,000 mL/min, thereby selectively oxidizing the polysilicon layer in the gate electrode.

In any one of the first to fourth aspects, it is preferable that the process pressure is 400 to 1,333 Pa, and the process temperature is 400 to 600° C.

According to a fifth aspect of the present invention, there is provided a semiconductor device manufacturing method comprising:

forming a gate insulating film on a semiconductor substrate;

forming, on the gate insulating film, a multilayered structure including at least a polysilicon layer and a metal layer containing a refractory metal;

forming a gate electrode by etching the multilayered structure;

performing first oxidation by performing a plasma process on the gate electrode by a plasma processing apparatus, which is configured to supply microwaves into a process chamber from a planar antenna including a plurality of slots and thereby to generate plasma, at a process pressure of 133.3 to 1,333 Pa and a process temperature of 400 to 800° C. by using a process gas containing at least hydrogen gas and oxygen gas; and performing second oxidation by performing a plasma process on the gate electrode by the plasma processing apparatus at a process pressure of 1.3 to 13.3 Pa and a process temperature of 250 to 800° C. by using a process gas containing at least hydrogen gas and oxygen gas.

In the fifth aspect, it is preferable that, in the first oxidation and the second oxidation, the process is performed while flow rates of the hydrogen gas, the oxygen gas, and a rare gas in the process gas are respectively 10 to 500, 10 to 500, and 0 to 2,000 ml/min.

In this case, it may be arranged that in the first oxidation, an oxide film is formed by oxidizing a sidewall of the polysilicon layer, and an oxide film thickness on an edge portion of the polysilicon layer is increased, and in the second oxidation, a film thickness of the oxide film on the sidewall of the polysilicon layer is further increased.

It is preferable that the film thickness of the oxide film formed in the first oxidation is 3 to 5 nm, and the film thickness of the oxide film formed in the second oxidation is 10 to 15 nm.

In any one of the first to fourth aspects, it is preferable that the semiconductor device is a transistor.

It is preferable that the metal layer is one of a tungsten layer and a tungsten silicide layer.

According to a sixth aspect of the present invention, there is provided a plasma oxidation method of selectively oxidizing, by plasma, a polysilicon layer in a target object from which at least the polysilicon layer and a metal layer containing a refractory metal are exposed, the plasma oxidation method comprising performing a plasma process by a plasma processing apparatus, which is configured to supply electromagnetic waves into a process chamber from an antenna and thereby to generate plasma, at a process pressure of 133.3 to 1,333 Pa and a process temperature of 250 to 800° C. by using a process gas containing at least hydrogen gas and oxygen gas.

According to a seventh aspect of the present invention, there is provided a plasma oxidation method of selectively oxidizing, by plasma, a polysilicon layer in a target object from which at least the polysilicon layer and a metal layer containing a refractory metal are exposed, the plasma oxidation method comprising performing a plasma process by a plasma processing apparatus, which is configured to supply electromagnetic waves into a process chamber from an antenna and thereby to generate plasma, at a process pressure of 133.3 to 1,333 Pa and a process temperature of 250 to 800° C., while flow rates of hydrogen gas, oxygen gas, and a rare gas in a process gas are respectively 10 to 500, 10 to 500, and 0 to 2,000 ml/min.

In the sixth or seventh aspect, it is preferable that the process pressure is 400 to 1,333 Pa, and the process temperature is 400 to 600° C.

According to an eighth aspect of the present invention, there is provided a plasma oxidation method of selectively oxidizing, by plasma, a silicon layer mainly containing silicon in a target object from which at least the silicon layer and a metal layer containing a refractory metal are exposed, the plasma oxidation method comprising:

performing first oxidation by performing a plasma process on the target object by a plasma processing apparatus, which is configured to supply electromagnetic waves into a process chamber from an antenna and thereby to generate plasma, at a process pressure of 133.3 to 1,333 Pa and a process temperature of 400 to 800° C. by using a process gas containing at least hydrogen gas and oxygen gas; and performing second oxidation by performing a plasma process on the target object by the plasma processing apparatus at a process pressure of 1.3 to 13.3 Pa and a process temperature of 250 to 800° C. by using a process gas containing at least hydrogen gas and oxygen gas.

In the eighth aspect, it is preferable that, the silicon layer is made of one of polysilicon, amorphous silicon, and conductor doped silicon.

It is preferable that, in the first oxidation and the second oxidation, the process is performed while flow rates of the hydrogen gas, the oxygen gas, and a rare gas in the process gas are respectively 10 to 500, 10 to 500, and 0 to 2,000 ml/min.

In this case, it may be arranged that in the first oxidation, an oxide film is formed by oxidizing a sidewall of the polysilicon layer, and an oxide film thickness on an edge portion of the polysilicon layer is increased, and in the second oxidation, a film thickness of the oxide film on the sidewall of the polysilicon layer is further increased.

It is preferable that the film thickness of the oxide film formed in the first oxidation is 3 to 5 nm, and the film thickness of the oxide film formed in the second oxidation is 10 to 15 nm In any one of the sixth to eighth aspects, it is preferable that the metal layer is one of a tungsten layer and a tungsten silicide layer According to a ninth aspect of the present invention, there is provided a control program for execution on a computer, wherein the control program, when executed, controls a plasma processing apparatus to perform a semiconductor device manufacturing method according to any one of the first to fifth aspects.

According to a tenth aspect of the present invention, there is provided a computer readable storage medium that stores a control program for execution on a computer, wherein the control program, when executed, controls a plasma processing apparatus to perform a semiconductor device manufacturing method according to any one of the first to fifth aspects According to an eleventh aspect of the present invention, there is provided a control program for execution on a computer, wherein the control program, when executed, controls a plasma processing apparatus to perform a plasma oxidation method according to any one of the sixth to eighth aspects.

According to a twelfth aspect of the present invention, there is provided a computer readable storage medium that stores a control program for execution on a computer, wherein the control program, when executed, controls a plasma processing apparatus to perform a plasma oxidation method according to any one of the sixth to eighth aspects.

According to a twelfth aspect of the present invention, there is provided a plasma processing apparatus comprising:
 a plasma supply source which generates plasma,
 a process chamber configured to be evacuated to process a target object by using the plasma;
 a controller which performs control to perform, in the process chamber, a plasma oxidation method according to any one of the sixth to eighth aspects.

The present invention controls the process pressure when oxidizing a polysilicon layer by using an RLSA type plasma processing apparatus, thereby making it possible to eliminate the variation in film thickness of an oxide film to be formed and improve the uniformity of the oxide film thickness on the surface of a semiconductor wafer.

It is also possible, by controlling the conditions such as the process temperature and gas ratio in addition to the process pressure, to appropriately round the edge portions of a polysilicon layer while suppressing excess birds beak formation, and improve the electrical characteristics by suppressing the leakage current in a semiconductor device subjected to oxidation.

In addition, the present invention can perform a high density, low electron temperature plasma process by using the RLSA type plasma processing apparatus, thereby decreasing damage to a substrate and forming a high quality oxide film. That is, although the low temperature process is performed, an oxide film on the sidewall of a polysilicon layer is dense and has very high film quality.

BEST MODE FOR CARRYING OUT THE INVENTION

A preferred embodiment of the present invention will be explained below with reference to the accompanying drawings.

Figure 1:
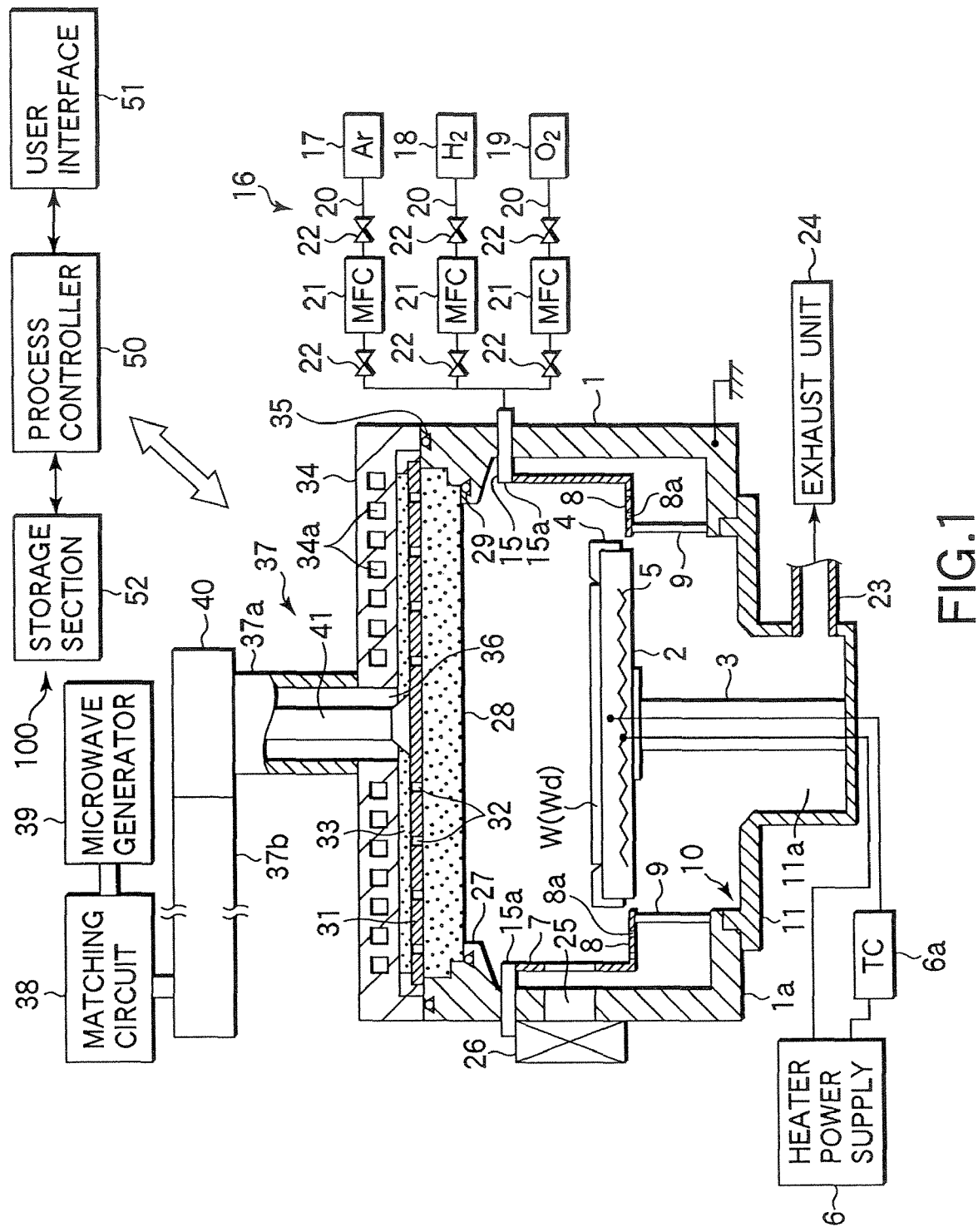
FIG. 1 This is a schematic sectional view showing an example of a plasma processing apparatus suited to practice a method of the present invention.

FIG. 1 is a sectional view schematically showing an example of a plasma processing apparatus suited to practice a plasma oxidation method of the present invention. This plasma processing apparatus is constructed as an RLSA (Radial Line Slot Antenna) microwave plasma processing apparatus capable of generating a high density, low electron temperature microwave plasma by supplying microwaves into a process chamber by using a planar antenna having a plurality of slots, particularly an RLSA, and is suitably used to, e.g., selectively oxidize the sidewalls of polysilicon of a gate electrode.

A plasma processing apparatus 100 has an almost cylindrical chamber 1 that is airtightly constructed and grounded. A circular opening 10 is formed in an almost central portion of a bottom wall 1a of the chamber 1, and the bottom wall 1a has an exhaust chamber 11 that communicates with the opening 10 and projects downward.

A susceptor 2 which is made of a ceramic such as AlN and horizontally supports a wafer W as a target substrate is formed in the chamber 1. The susceptor 2 is supported by a cylindrical support member 3 that is made of a ceramic such as AlN and extends upward from the center of the bottom portion of the exhaust chamber 11. A guide ring 4 for guiding the wafer W is formed on the edge of the susceptor 2. Also, a resistance heating type heater 5 is embedded in the susceptor 2 and heats the susceptor 2 when supplied with power from a heater power supply 6, thereby heating the wafer W to be processed. In this case, the process temperature can be controlled from room temperature to 800° C. Also, a thermocouple 6a is connected to the susceptor 2. The thermocouple 6a senses the temperature of the susceptor 2 and feeds back the temperature to the heater power supply 6, thereby performing temperature control. Note that a cylindrical liner 7 made of quartz is formed along the inner circumferential surface of the chamber 1. In addition, an annular baffle plate 8 having a large number of exhaust holes 8a is formed along the outer circumferential surface of the susceptor 2 to evenly evacuate the chamber 1, and the baffle plate 8 is supported by a plurality of posts 9.

The susceptor 2 has wafer support pins (not shown) for supporting and vertically moving the wafer W, such that the wafer support pins can project from and retract in the surface of the susceptor 2.

An annular gas supply member 15 is formed on the sidewall of the chamber 1, and a gas supply system 16 is connected to the gas supply member 15. The gas supply member 15 has a plurality of gas discharge holes 15a evenly formed in the horizontal direction in the inner wall of the chamber 1. Note that the gas supply member can take the form of a shower or nozzle. The gas supply system 16 has, e.g., an Ar gas supply source 17, $H_2$ gas supply source 18, and $O_2$ gas supply source 19, and these gases are supplied to the gas supply member 15 through gas lines 20, and supplied into the chamber 1 from the gas supply member 15. The gas lines 20 each have a mass flow controller 21 and switching valves 22 one on either side of the mass flow controller 21. Note that a process gas may also contain a rare gas such as Kr, He, Ne, or Xe gas instead of Ar gas as will be described later, or may not contain any rare gas.

An exhaust pipe 23 is connected to the side surface of the exhaust chamber 11, and an exhaust unit 24 including a high speed vacuum pump is connected to the exhaust pipe 23. A gas in the chamber 1 is evenly discharged into a space 11a of the exhaust chamber 11 and exhausted through the exhaust pipe 23 by operating the exhaust unit 24. This makes it possible to rapidly evacuate the chamber 1 to a predetermined vacuum degree, e.g., 0.133 Pa.

The sidewall of the chamber 1 has a transfer port 25 for loading and unloading the wafer W with respect to a transfer chamber (not shown) adjacent to the plasma processing apparatus 10, and a gate valve 26 for opening and closing the transfer port 25.

The upper portion of the chamber 1 has an opening, and an annular support portion 27 is formed along the edge of this opening. A microwave transmission plate 28 which is made of quarts or a ceramic such as $Al_2O_3$ and transmits microwaves is airtightly attached to the support portion 27 with a sealing member 29 interposed between them. Accordingly, the interior of the chamber 1 is airtightly sealed.

Figure 2:
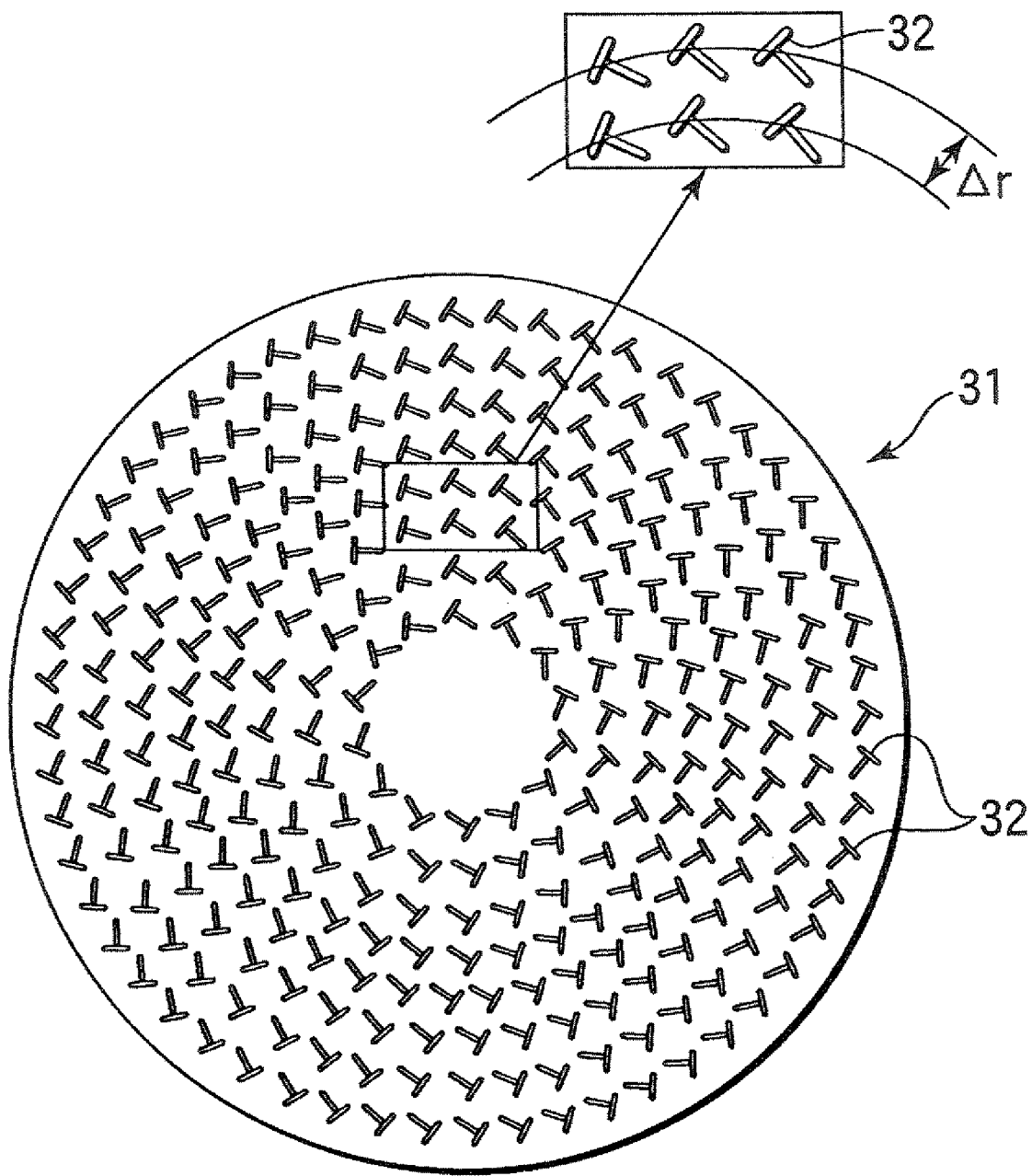
FIG. 2 This is a view showing the structure of a planar antenna member.

A disc like planar antenna member 31 is formed above the microwave transmission plate 28 so as to oppose the suscepter 2. This planar antenna member 31 is locked to the upper end of the sidewall of the chamber 1. When an object to be processed is, e.g., an 8 inch size wafer W, the planar antenna member 31 is a disc made of a conductive material and having a diameter of 300 to 400 mm and a thickness of 1 to a few mm (e.g., 5 mm). Note that the planar antenna member 31 may also be a square plate or the like in accordance with the shape of the chamber 1. More specifically, the planar antenna member 31 is made of a copper plate or aluminum plate having a silver plated or gold plated surface, and has a structure in which a large number of microwave radiation holes 32 (slots) having a predetermined pattern extend through the plate. As shown in FIG. 2, the microwave radiation hole 32 is formed of a long slit, adjacent microwave radiation holes 32 are typically arranged into a T-shape, and a plurality of microwave radiation holes 32 are concentrically arranged. The length and interval of the microwave radiation holes 32 are determined in accordance with the wavelength (λg) of microwaves. For example, the microwave radiation holes 32 are arranged such that the interval is λg/2 or λg. Note that in FIG. 2, Δr indicates the interval between concentrically formed adjacent microwave radiation holes 32. Also, the microwave radiation hole 32 may also have another shape such as a circle or circular arc. Furthermore, the arrangement form of the microwave radiation holes 32 is not particularly limited to the concentric shape. For example, the microwave radiation holes 32 may also be spirally or radially arranged.

The upper surface of the planar antenna member 31 has a wave-retardation body 33 having a dielectric constant larger that of vacuum. Since the wavelength of microwaves increases in a vacuum, the wave-retardation body 33 has a function of uniformly and efficiently adjusting plasma by shortening the wavelength of radiated microwaves. Note that the planar antenna member 31 and microwave transmission plate 28 are in tight contact, and the wave-retardation body 33 and planar antenna member 31 are also in tight contact, but they may also be separated from each other.

A shield lid 34 made of a metal material such as aluminum, stainless steel, or copper is formed on the upper surface of the chamber 1 so as to cover the planar antenna member 31 and wave-retardation body 33. A sealing member 35 seals the upper surface of the chamber 1 and the shield lid 34. Cooling water channels 34a are formed in the shield lid 34, and the shield lid 34, wave-retardation body 33, planar antenna 31, and microwave transmission plate 28 are cooled by supplying cooling water to the cooling water channels 34a.

An opening 36 is formed in the center of the upper wall of the shield lid 34, and a waveguide tube 37 is connected to this opening. A microwave generator 39 is connected to the end portion of the waveguide tube 37 via a matching circuit 38. Therefore, microwaves generated by the microwave generator 39 and having a frequency of, e.g., 2.45 GHz are propagated to the planar antenna member 31 via the waveguide tube 37. Note that it is also possible to use, e.g., 8.35 or 1.98 GHz as the frequency of the microwaves.

The waveguide tube 37 has a coaxial waveguide tube 37a having a circular sectional shape and extending upward from the opening 36 of the shield lid 34, and a rectangular waveguide tube 37b connected to the upper end portion of the coaxial waveguide tube 37a via a mode transducer 40 and extending in the horizontal direction. The mode transducer 40 between the rectangular waveguide tube 37b and coaxial waveguide tube 37a has a function of converting microwaves propagated in the TE mode in the rectangular waveguide tube 37b into the TEM mode. An inner conductor 41 extends through the center of the coaxial waveguide tube 37a, and the lower end portion of the inner conductor 41 is connected and fixed to the center of the planar antenna member 31. This allows the microwaves to evenly and efficiently propagate to the planar antenna member 31 through the inner conductor 41 in the coaxial waveguide tube 37a.

The respective components of the plasma processing apparatus 100 are connected to and controlled by a process controller 50 including a CPU. The process controller 50 is connected to a user interface 51 including, e.g. a keyboard and a display, wherein the keyboard is used for a process operator to input commands for operating the plasma processing apparatus 100, and the display is used for showing visualized images of the operational status of the plasma processing apparatus 100.

Further, the process controller 50 is connected to a storage section 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

The plasma processing apparatus 100 constructed as above can advance a damage free plasma process on an underlying film or the like at a low temperature of 800° C. or less, and can also achieve a uniform plasma process because the plasma uniformity is high.

Figure 3A:
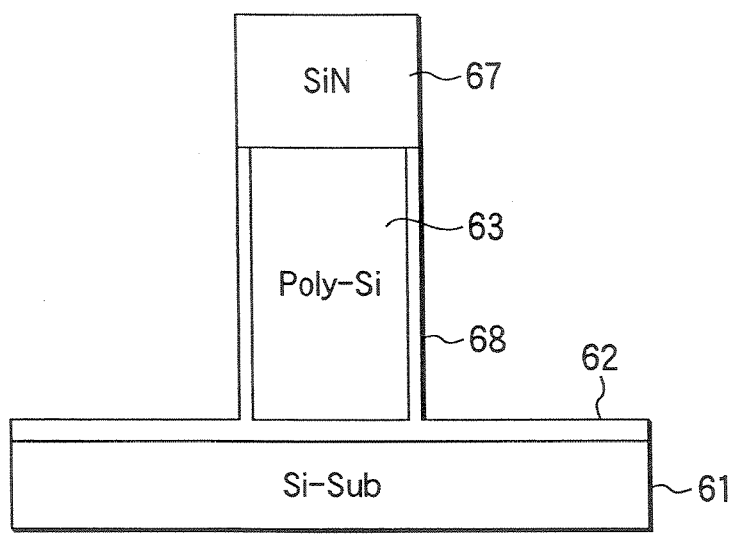
FIG. 3A This is a view showing the structure of a gate electrode made of polysilicon.
Figure 3B:
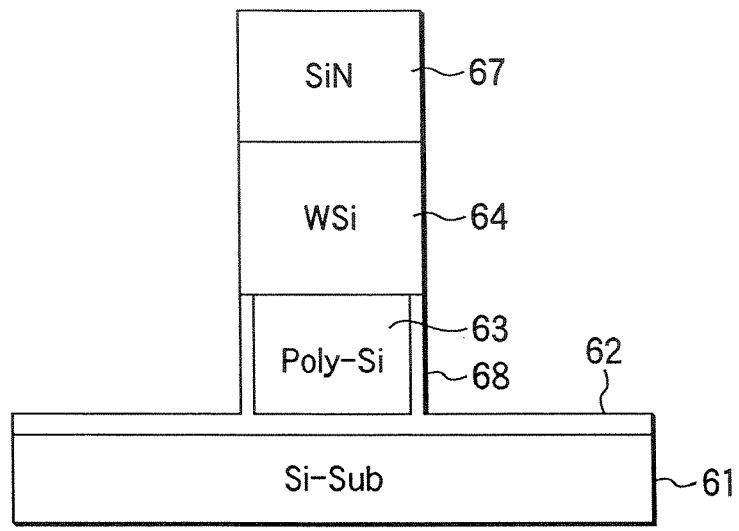
FIG. 3B This is a view showing the structure of an example of a gate electrode including a W based film.
Figure 3C:
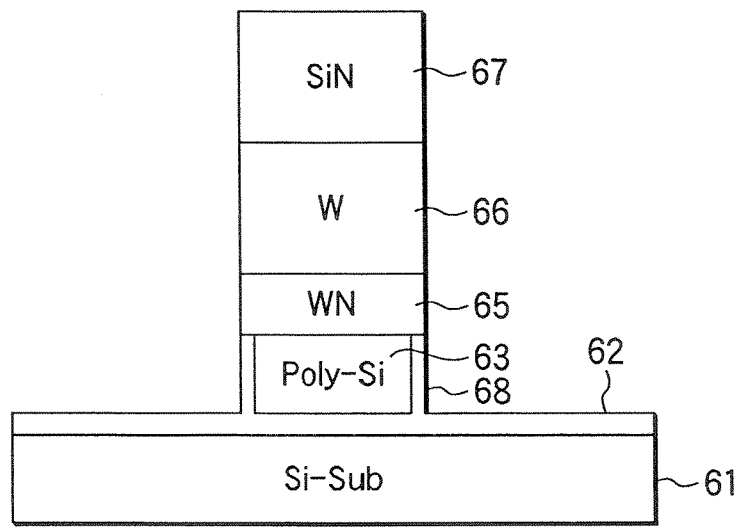
FIG. 3C This is a view showing the structure of another example of the gate electrode including a W based film.

As described previously, the plasma oxidation apparatus 100 can be suitably used to oxidize the polysilicon layer of the gate electrode. As shown in FIG. 3A, the gate electrode is conventionally obtained by forming a polysilicon layer 63 on a gate insulating film 62 on an Si substrate 61 such as a silicon wafer. However, to meet requirements for miniaturization design rules resulting from the increase in integration degree and speed of LSIs, demands have arisen for high accuracy control of sidewall oxidation of the gate electrode and a low resistance of the gate electrode, so gates using tungsten (W) are employed. An examples is a tungsten polycide structure as shown in FIG. 3B in which a polysilicon layer 63 is formed on a gate insulating film 62 on an Si substrate 61, and a tungsten silicide (WSi) layer 64 is formed on the polysilicon layer 63. Another examples is a tungsten poly-metal gate structure as shown in FIG. 3C in which a polysilicon layer 63 is formed on a gate insulating film 62 on an Si substrate 61, and a tungsten nitride (WN) barrier layer 65 and tungsten (W) layer 66 are further formed thereon. The latter example has a resistance lower than that of the tungsten polycide structure and is used in a high speed device. Note that in FIGS. 3A to 3C, reference numeral 67 denotes a hard mask layer that is an insulating film made of silicon nitride (SiN) or the like, and used to etch the gate electrode. Reference numeral 68 denotes an oxide film formed by selective oxidation.

When selectively oxidizing the gate electrode by the plasma processing apparatus 100, the wafer W having the gate electrode formed thereon is first loaded into the chamber 1 from the transfer port 25 by opening the gate valve 26, and placed on the suscepter 2.

Ar gas, $H_2$ gas, and $O_2$ gas are respectively supplied at predetermined flow rates from the Ar gas supply source 17, $H_2$ gas supply source 18, and $O_2$ gas supply source 19 of the gas supply system 16 into the chamber 1 via the gas supply member 15, and maintained at a predetermined process pressure. The process conditions, e.g., the flow rates are preferably set such that Ar gas: 0 to 2,000 mL/min, $H_2$ gas: 10 to 500 mL/min, and $O_2$ gas: 10 to 500 mL/min. The flow rate ratio ($H_2/O_2$) of $H_2$ gas to $O_2$ gas can be 1 or more, preferably, 2 or more, and more preferably, 2 to 8. In this case, the chamber internal pressure is preferably 133.3 to 1,333 Pa, and the process temperature (wafer temperature) is preferably 250 to 800° C. This makes it possible to perform favorable oxidation with a small oxide film thickness difference on exposed polysilicon. In particular by selecting 266.7 to 700 Pa, more preferably, 400 to 700 Pa as the process pressure and 250 to 800° C., more preferably, 400 to 800° C. as the process temperature, it is possible to increase the oxide film thickness on an edge region and reduce the gate leakage current while suppressing excess bird's beak formation. In addition, the above conditions allow the progress of the selective oxidation reaction of polysilicon while suppressing the oxidation of tungsten.

Then, microwaves from the microwave generator 39 are supplied to the waveguide tube 37 via the matching circuit 38. The microwaves are supplied to the planar antenna member 31 through the rectangular waveguide tube 37b, mode transducer 40, and coaxial waveguide tube 37a in this order, and radiated from the planar antenna member 31 to the space above the wafer W in the chamber 1 through the microwave transmission plate 28. The microwaves are propagated in the TE mode in the rectangular waveguide tube 37b and converted into the TEM mode by the mode transducer 40, and the TEM mode microwaves are propagated in the coaxial waveguide tube 37a toward the planar antenna member 31. The microwave power is preferably 1,500 to 5,000 W.

The microwaves radiated from the planar antenna member 31 to the chamber 1 through the microwave transmission plate 28 form an electromagnetic field in the chamber 1, this electromagnetic field generates plasma of $H_2$ gas, Ar gas, and $O_2$ gas, and the plasma selectively oxidizes the exposed sidewalls of polysilicon of the gate electrode. This microwave plasma has a high density of about $5 \times 10^{11}$ to $1 \times 10^{13}/cm^3$ or more because the microwaves are radiated from the large number of microwave radiation holes 32 of the planar antenna member 31. The electron temperature of the plasma is about 0.7 to 2 eV, and the plasma density uniformity is ±5% or less. Accordingly, a thin oxide film can be formed by performing selective oxidation at a low temperature for a short time, and there is also the merit that a high quality oxide film can be formed because plasma damage caused by, e.g., ions to the underlying film is small.

Also, since selective oxidation of polysilicon is performed by the high density plasma at a low temperature for a short time by using a gas mixture containing $H_2$ as described above, the gate electrodes containing tungsten (W) as shown in FIGS. 3B and 3C can be formed with extremely high accuracy by minimizing the sublimation of $WO_x$ ($WO_3$, $WO_2$, or WO)

caused by the oxidation of tungsten (W). As a mechanism by which hydrogen suppresses the oxidation of tungsten, reactions indicated by $$W + 3O^* \rightarrow WO_3 \quad (1)$$

$$WO_3 + 3H^* \rightarrow W + 3OH^* \quad (2)$$

presumably occur. Accordingly, the oxidation of tungsten can be suppressed by performing a process at an $H_2/O_2$ ratio by which the reaction proceeds to formula (2).

Figure 4A:
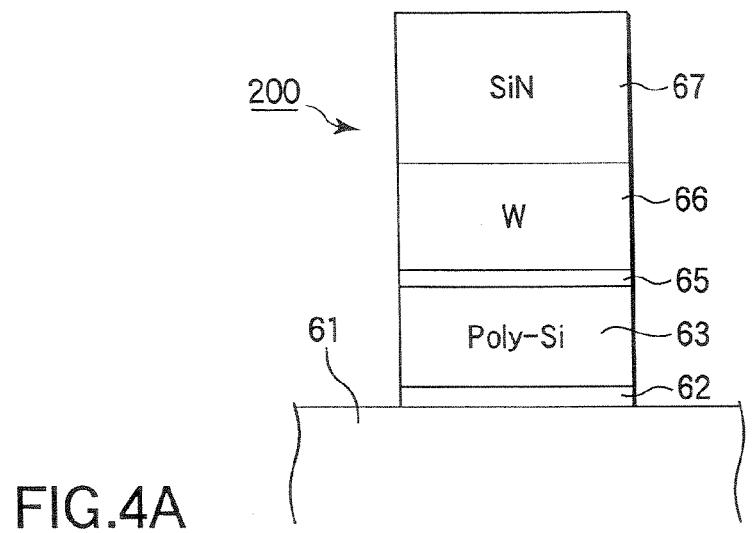
FIG. 4A This is a view schematically showing a gate electrode before a plasma oxidation process.
Figure 4B:
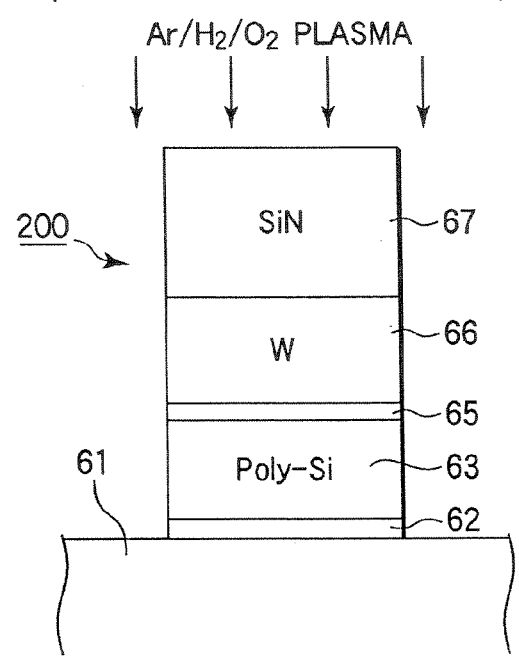
FIG. 4B This is a view schematically showing the gate electrode during a plasma oxidation process.
Figure 4C:
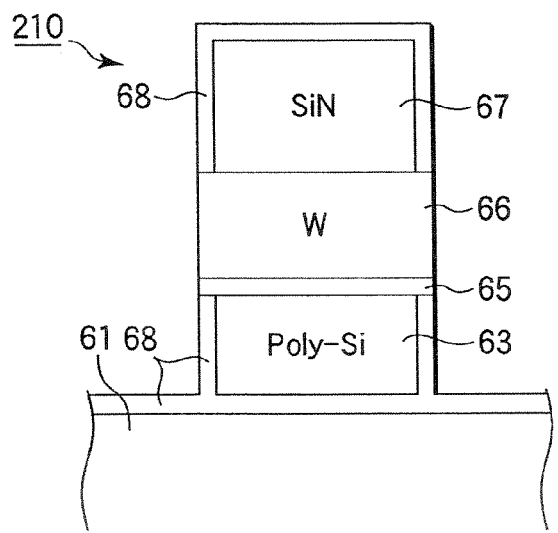
FIG. 4C This is a view schematically showing the gate electrode after a plasma oxidation process.

Semiconductor device fabrication steps according to a method of the present invention will be explained below by taking a gate electrode forming a MOS transistor of a semiconductor device such as a DRAM or flash memory as an example. FIGS. 4A to 4C schematically illustrate the way an oxide film 68 is selectively formed on a gate electrode 200. FIG. 4A shows the gate electrode 200 after etching. Reference numeral 61 denotes an Si substrate.

In the procedure of forming the gate electrode 200, a $P^+$- or $N^+$-doped well region (diffusion region; not shown) is first formed in the Si substrate 61, and then a gate insulating film 62 ($SiO_2$) is formed by thermal oxidation or the like. A polysilicon layer 63 is formed on the gate insulating film 62 by CVD, and a tungsten layer 66 made of tungsten as a refractory electrode material is formed for the purpose of decreasing the resistivity of the gate electrode 200 in order to raise the operating speed. The tungsten layer 66 can be formed by, e.g., CVD or sputtering. Tungsten silicide (WSi) may also be used instead of the tungsten layer 66. Note that before the formation of the tungsten layer 66, a nitride layer or the like is formed as a very thin diffusion barrier layer 65 on the polysilicon layer 63 in order to prevent the diffusion of high resistance WSi by silicidation caused by the interdiffusion between W and Si in the interface. This example uses tungsten nitride as the barrier layer 65. Note that this nitride layer may also be formed by nitriding polysilicon by using $NH_3$, $N_2$, or a gas mixture of $N_2$ and $H_2$.

A hard mask 67 made of, e.g., silicon nitride is formed on the tungsten layer 66, and a photoresist film (not shown) is formed on the hard mask 67.

After that, the photoresist film is used as a mask to etch the hard mask layer 67 by photolithography, and the photoresist film and hard mask layer 67 or the hard mask layer 67 is used as a mask to sequentially etch the tungsten layer 66, barrier layer 65, and polysilicon layer 63, thereby forming the gate electrode 200. The series of etching processes have exposed the sidewalls of the polysilicon layer 63 and tungsten layer 66 on the side surfaces of the gate electrode 200, and etched away the gate insulating film 62.

As shown in FIG. 4B, the plasma processing apparatus 100 performs plasma oxidation on the gate electrode 200 thus formed, by performing control such that hydrogen gas and oxygen gas have a predetermined flow rate ratio.

This plasma oxidation is preferably performed at a high pressure in order to improve the uniformity of the oxide film on the surface of the wafer W, particularly, to eliminate the difference between the oxide film thicknesses on the sidewalls of the polysilicon layer 63 produced by the difference in density between the gate patterns, (difference between open and dense portions). At a low pressure of, e.g., about 6.7 Pa, the ion potential energy in the plasma is high, so the supply rate controls the oxidation reaction. By contrast, at a relatively high pressure of, e.g., 400 Pa or more, oxidation species mainly containing radicals increase, so the reaction rate controls the oxidation reaction. This presumably makes it possible to evenly advance the oxidation reaction regardless of the pattern density, and ensure the uniformity of the oxide film thickness.

Accordingly, the internal process pressure of the chamber can be set at, e.g., 133.3 to 1,333 Pa (1 to 10 Torr), preferably, 266.7 Pa or more, and more preferably, 400 to 700 Pa. As the process gas, a gas containing $H_2$ gas and $O_2$ gas can be preferably used, and a rare gas selected from, e.g., Ar, He, e, and Kr may also be contained. The process gas flow rates are preferably set such that rare gas such as Ar: 0 to 2,000 mL/min, $H_2$ gas: 10 to 500 mL/min, and $O_2$ gas: 10 to 500 mL/min, more specifically, rare gas: 1,000 mL/min, $H_2$ gas: 200 mL/min, and $O_2$ gas: 100 mL/min.

Also, the process temperature can be set at 250 to 800° C. as the temperature of the wafer W, and is preferably 400 to 800° C., and more preferably, 400 to 600° C. in order to increase the oxide film thickness on the edge region of the polysilicon layer 63 as will be described later.

When plasma oxidation is performed under the above conditions, the oxide film 68 is selectively and evenly formed on the surfaces of the polysilicon layer 63 regardless of the density of the gate pattern. No oxide film is formed on the sidewalls of the tungsten layer 66 and barrier layer 65, and a gate electrode 210 as shown in FIG. 4C is formed. Note that the oxide film is also slightly formed on the Si substrate and SiN surface. It is also possible to similarly form a gate electrode including a film of another refractory material, e.g., molybdenum, tantalum, titanium, or a silicide, nitride, or alloy of any of these metals, instead of the tungsten layer 66

Figure 5A:
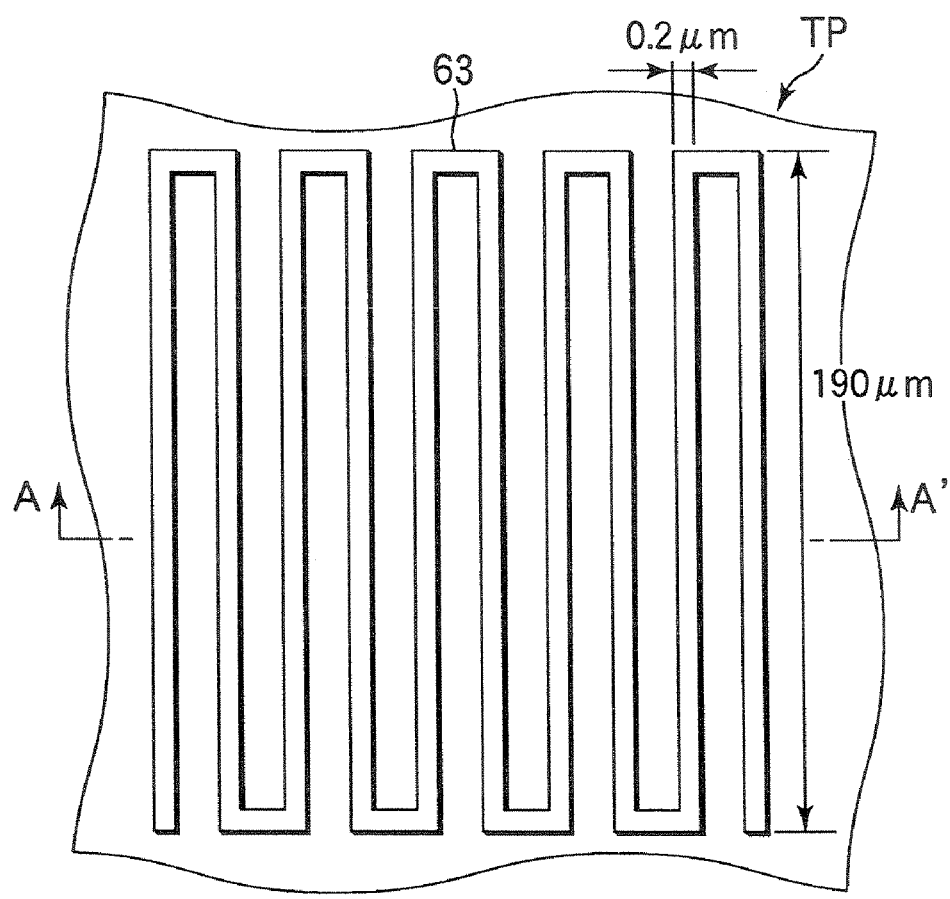
FIG. 5A This is an enlarged plan view showing an outline of the arrangement of a test pattern.
Figure 5B:
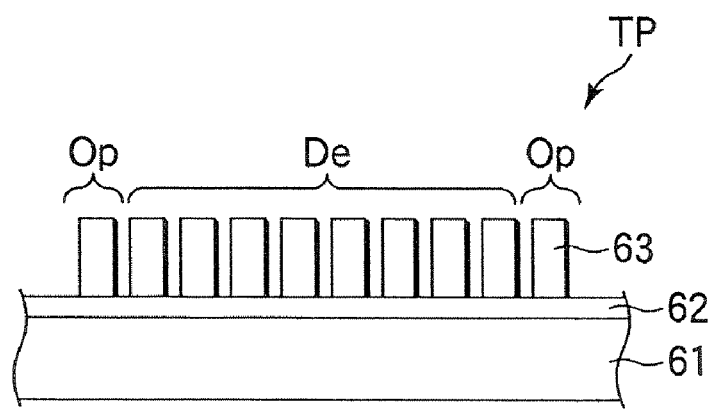
FIG. 5B This is a sectional view taken along a line A-A' in FIG. 5A.

The results of a test for confirming the effects of the present invention will be explained below. A line & space snake pattern TP as shown in FIG. 5A was formed as a test pattern on the wafer W. The width of the polysilicon layer 63 was 0.2 μm, and the line interval (space) was 6.8 μm FIG. 5B shows a sectional structure taken along a line A-A' in FIG. 5A. The film thickness of the gate insulating film 62 on the Si substrate 61 was 4 to 7 nm, and the height of the polysilicon layer 63 was 150 nm. The total edge length was $3.9 \times 10^3$ μm, and the pattern area was $3.9 \times 10^2$ μm².

With respect to the test pattern TP, the plasma processing apparatus 100 shown in FIG. 1 was used to oxidize the sidewalls of the polysilicon layer 63 by changing the process pressure. The process pressure was changed to 6.7 Pa (50 mTorr), 133.3 Pa (1 Torr), 400 Pa (3 Torr), and 667 Pa (5 Torr).

The process gas flow rates in this plasma oxidation were $Ar/O_2/H_2 = 1,000/100/200$ mL/min (sccm), the process temperature (substrate process temperature) was 250° C., the power supplied to the plasma was 3.4 kW, and the process time was set such that the film thickness of the oxide film 68 formed on the sidewalls of the polysilicon layer 63 was 6 nm.

The oxide film 68 on the sidewalls of the oxidized polysilicon layer 63 was measured in an open region Op and a dense region De of the test pattern TP. As shown in FIG. 5B, the open region Op is a rough region having many spaces near the two ends of the line of the test pattern TP, and the dense region De is a fine region having few spaces sandwiched between the lines of the zigzagged test pattern TP.

Figure 6:
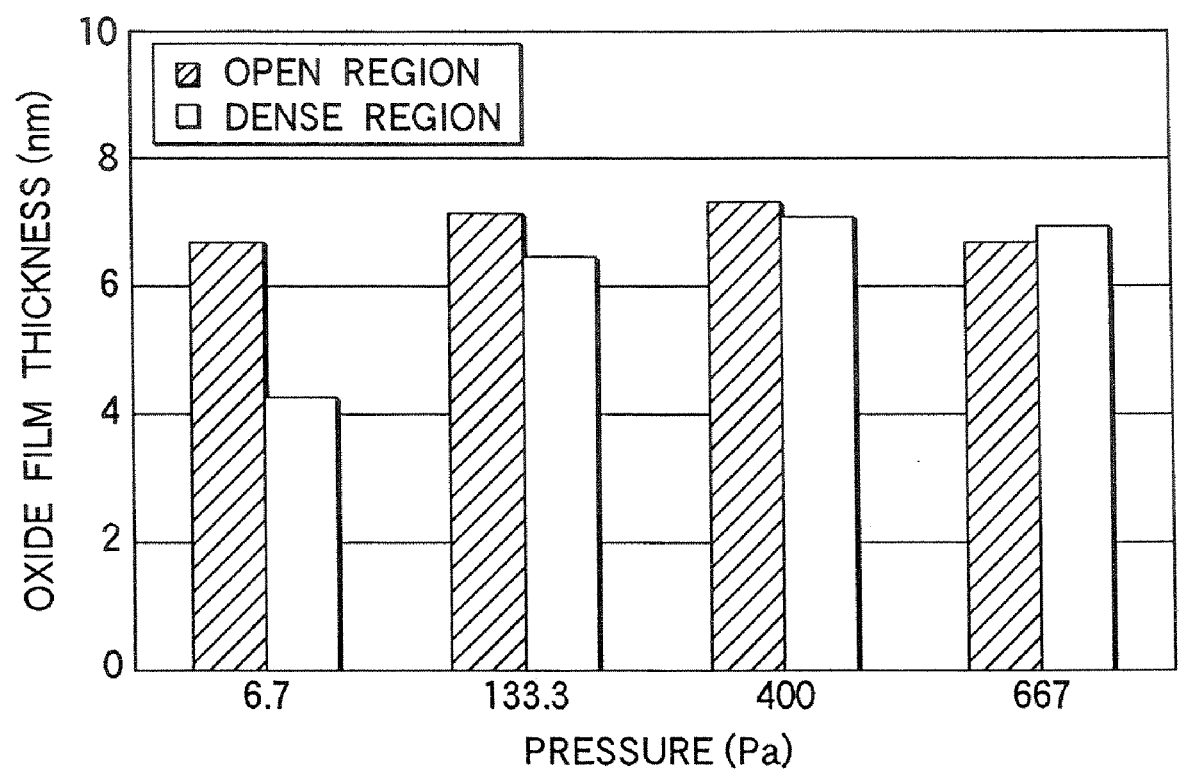
FIG. 6 This is a graph showing the relationship between the pressure and oxide film thickness in an oxidation process.

FIG. 6 shows the film thickness of the oxide film 68 on the sidewalls of the polysilicon layer 63. As shown in FIG. 6, at a low process pressure of about 6.7 Pa, there was a difference between the film thicknesses of the oxide film 68 on the sidewalls of the polysilicon layer 63 in the open region Op and dense region De such that the oxide film thickness in the dense region De was smaller. This film thickness difference considerably decreased at a process pressure of 133.3 Pa, and the film thicknesses in the open region Op and dense region De were almost equal when the process pressure was 400 Pa or more, indicating the uniformity of the oxide film thickness on the wafer surface. Accordingly, a process pressure for making the oxide film thickness uniform is 133.3 Pa or more, preferably, 266.7 Pa or more, and more preferably, 400 Pa or more.

Figure 7:
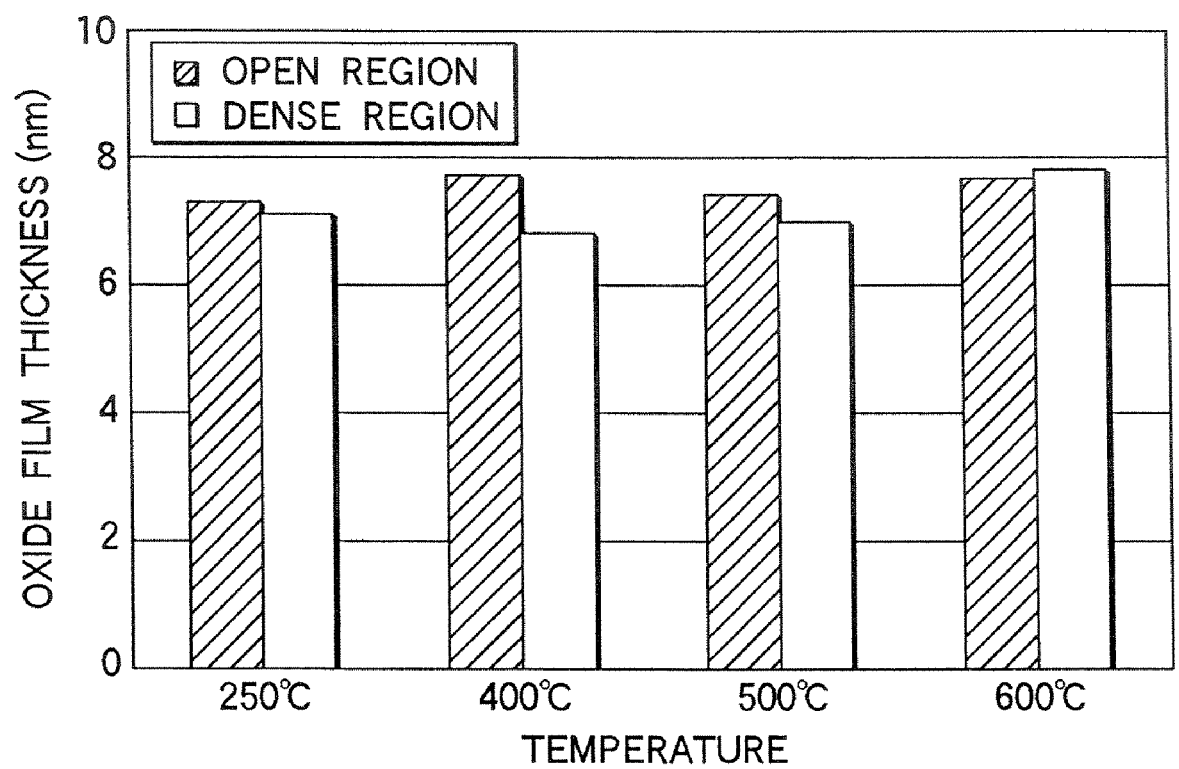
FIG. 7 This is a graph showing the relationship between the temperature and oxide film thickness in an oxidation process.

Then, with respect to the test pattern TP shown in FIG. 5, the plasma processing apparatus 100 shown in FIG. 1 was used to oxidize the sidewalls of the polysilicon layer 66 by changing the process temperature (substrate process temperature). The process temperature was changed to 250° C., 400° C., 500° C., and 600° C. The process pressure was 400 Pa (3 Torr), the process gas flow rates in this plasma oxidation were $Ar/O_2/H_2=1,000/100/200$ mL/min (sccm), the power supplied to the plasma was 3.4 kW, and the process time was set such that the film thickness of the oxide film 68 formed on the sidewalls of the polysilicon layer 63 was 6 nm. FIG. 7 shows the results.

As shown in FIG. 7, at a high pressure of 400 Pa, there was no big difference between the oxide film thicknesses on the polysilicon layer 63 in the open region Op and dense region De when the process temperature was 250 to 600° C. as the temperature of the wafer W. Accordingly, a process temperature of 250° C. or more is presumably favorable to assure a uniform oxide film thickness on the sidewalls of the polysilicon layer 63, and a process temperature of 400° C. or more is more favorable to improve the oxide film quality. Also, the dependence on the process temperature was small at a high pressure of, e.g., 400 Pa or more.

Then, with respect to the test pattern TP shown in FIG. 5, the plasma processing apparatus 100 shown in FIG. 1 was used to oxide the sidewalls by changing the process pressure, and the oxidation rate was checked.

The process pressure was changed to 133.3 Pa (1 Torr), 400 Pa (3 Torr), 667 Pa (5 Torr), 933 Pa (7 Torr), and 1,200 Pa (9 Torr).

Figure 8:
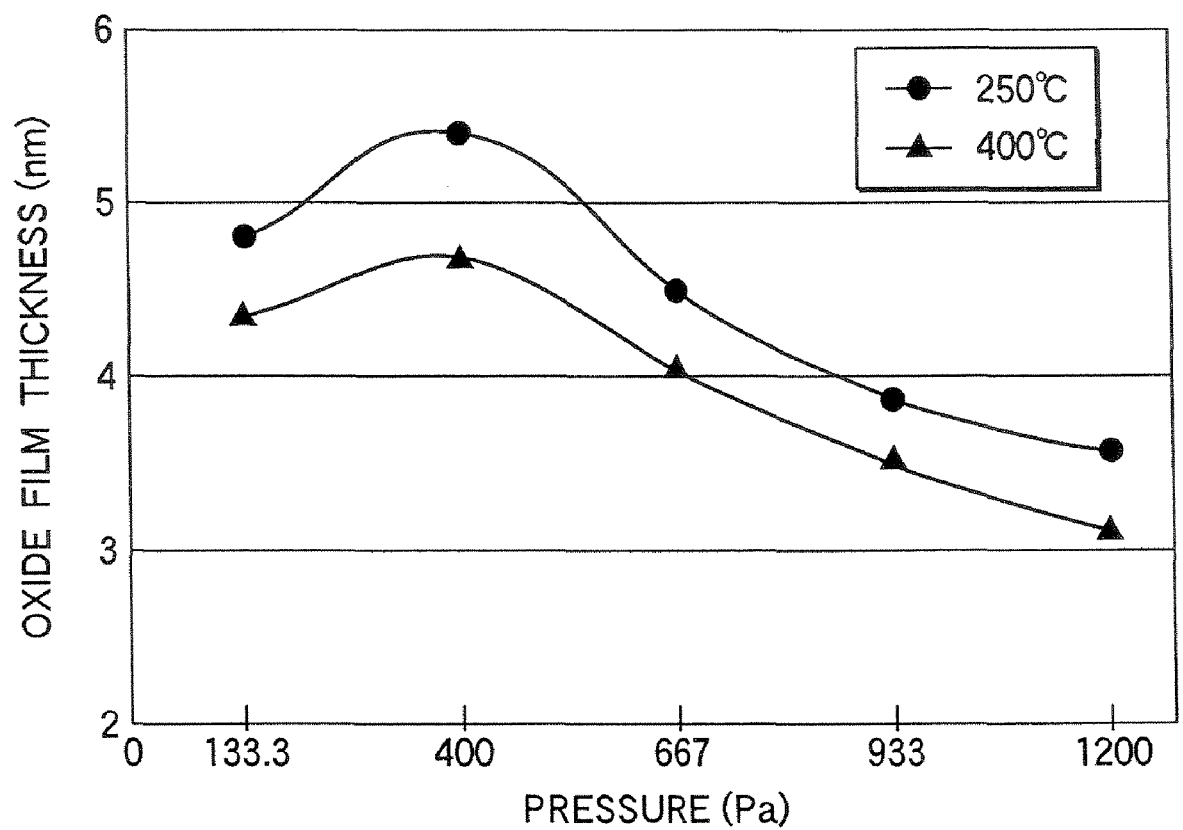
FIG. 8 This is a view showing the oxidation rate of an oxidation process, i.e., a graph showing the relationship between the pressure and oxide film thickness.

The process gas flow rates in this plasma oxidation were $Ar/O_2/H_2=1,000/100/200$ mL/min (sccm), the process temperature (substrate process temperature) was 250° C. or 400° C., the power supplied to the plasma was 3.4 kW, and the process time was set to 180 sec. FIG. 8 shows the results.

As shown in FIG. 8, a highest oxidation rate was obtained at about 400 Pa regardless of whether the process temperature was 250° C. or 400° C., and the oxidation rate was relatively high at about 133.3 to 667 Pa. When the process pressure further rose from 667 Pa, the oxidation rate gradually deceased. Putting the results shown in FIGS. 6 and 8 together, the oxidation pressure is preferably about 66.7 Pa to 1,200 Pa or higher (e.g., about 1,333 Pa), and a process pressure range suited to obtain a relatively high oxidation rate and improve the uniformity of the oxide film thickness on the sidewalls is 133.3 to 800 Pa, preferably, about 266.7 to 700 Pa, and more preferably, about 400 to 700 Pa.

Figure 9:
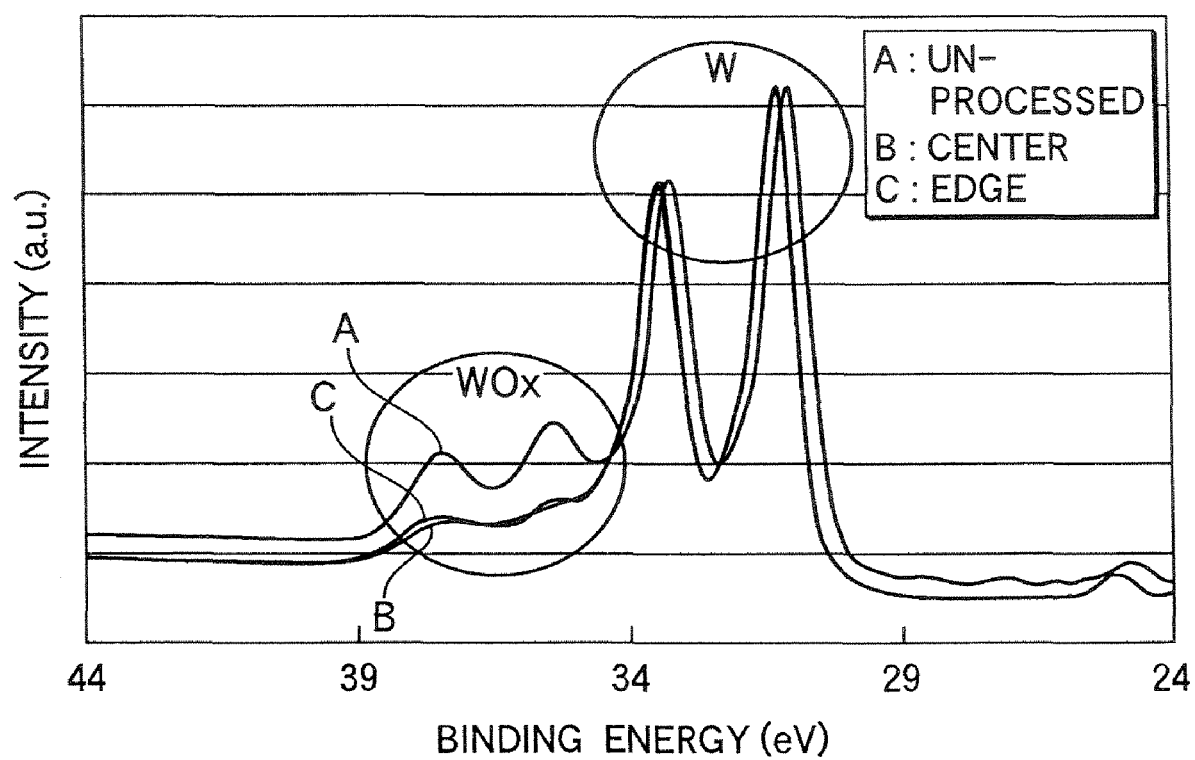
FIG. 9 This is a graph showing a tungsten 2p spectrum obtained by surface analysis using an XPS apparatus.

FIG. 9 shows the results of surface analysis performed by an XPS analyzer (X-Ray Photoelectron Spectroscopy Analysis) on the tungsten layers 66 of gate electrodes positioned in the center and on the edge of the wafer W after the plasma processing apparatus 100 oxidized the polysilicon exposed surfaces of the gate electrodes on an Si substrate such that the oxide film thickness was 6 nm. Note that in FIG. 9, a curve A indicates the measurement result of an unprocessed wafer (when no oxidation was performed), and curves B and C respectively indicate the measurement results of the center and edge. In this test, the $Ar/O_2/H_2$ flow rates were 1,000/100/200 mL/min(sccm), the process pressure was 400 Pa, the process temperature (wafer temperature) was 250° C., and the power supplied to the plasma was 3.4 kW.

As shown in FIG. 9, the peak intensity of $WO_x$ (e.g., $WO_3$) produced by the oxidation of tungsten was highest when the wafer was unprocessed as indicated by the curve A. This reveals that when the plasma processing apparatus 100 performed a plasma process on the substrate under the oxidation process conditions of the present invention, not only the formation of $WO_3$ was suppressed, but also tungsten oxide formed when the surface was naturally oxidized during or after etching was also reduced. Accordingly, the oxidation process conditions of the present invention can selectively oxidize only the polysilicon layer 63 while preventing the oxidation of a metal such as the tungsten layer 66.

Figure 10A:
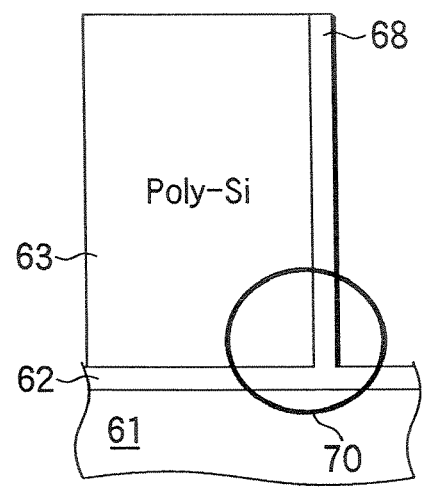
FIG. 10A This is a schematic view showing the shape of an edge portion of a gate electrode polysilicon layer, and shows the state in which no bird's beak is formed.
Figure 10B:
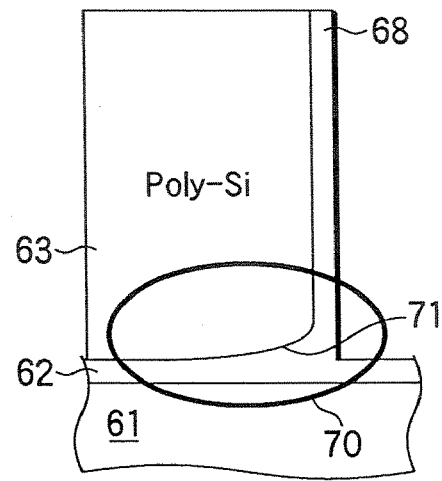
FIG. 10B This is a schematic view showing the shape of an edge portion of a gate electrode polysilicon layer, and shows the state in which an excess bird's beak is formed.
Figure 10C:
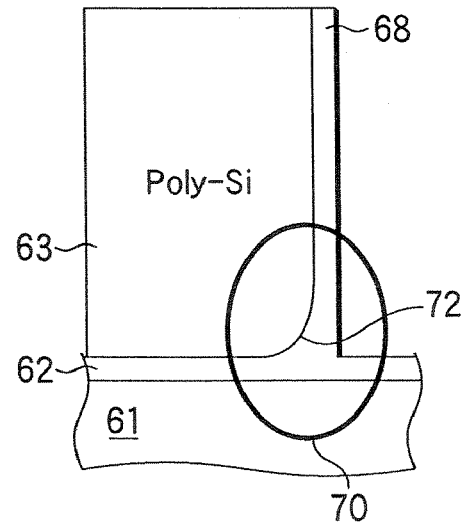
FIG. 10C This is a schematic view showing the shape of an edge portion of a gate electrode polysilicon layer, and shows the state in which a small bird's beak is properly formed.

Bird's beak control will be explained below with reference to FIGS. 10 to 14. FIGS. 10A to 10C each schematically show the form of an edge portion (corner portion) 70 of an oxidized polysilicon layer 63. First, FIG. 10A shows the state in which no bird's beak 71 is formed on the edge portion 70. In this state, the shape of the edge portion 70 is acute, so electric field concentration may increase the gate leakage current.

On the other hand, FIG. 10B shows the state in which a bird's beak 71 is formed. In this state, an active oxidizer such as an oxygen radical (O*) or oxygen ion (O⁻) diffuses in the interface between the polysilicon layer 63 and a silicon substrate 61, so oxidation progresses, and an oxide film (gate insulating film 62) grows. The bird's beak 71 like this significantly readily forms especially in thermal oxidation. The preferred embodiment of the present invention can obtain the state in which the edge portion 70 of the polysilicon 63 is slightly rounded, i.e. a small bird's beak 72 is formed as shown in FIG. 10C. In this state, it is possible to obtain a highly reliable gate electrode having no increase in gate oxide film and capable of corresponding to micropatterning, while preventing the increase in leakage current from the edge portion 70.

As described previously, RLSA microwave plasma oxidation performed using the plasma processing apparatus 100 shown in FIG. 1 has the merit that it is possible to suppress a bird's beak that is a serious problem in thermal oxidation, but also has the problem that, if no bird's beak forms as shown in FIG. 10A, the shape of the edge portion 70 of the polysilicon layer 63 where an electric field readily concentrates becomes acute, and this increases the leakage current. Therefore, the following examination was made on oxidation conditions for controlling the shape of the edge portion 70 of the polysilicon layer 63 into the shape having the small bird's beak 72 as shown in FIG. 10C.

First, the plasma processing apparatus 100 shown in FIG. 1 was used to oxidize the test pattern TP shown in FIGS. 5A and 5B by changing the process pressure. The process pressure was changed to 67 Pa (0.5 Torr), 133.3 Pa (1 Torr), 400 Pa (3 Torr), and 667 Pa (5 Torr)

The process gas flow rates in this plasma oxidation were $Ar/O_2/H_2=1,000/100/200$ mL/min (sccm), the process temperature (substrate process temperature) was 600° C., the power supplied to the plasma was 3.4 kW, and the process time was set such that the oxide film thickness was 6 nm.

Figure 11:
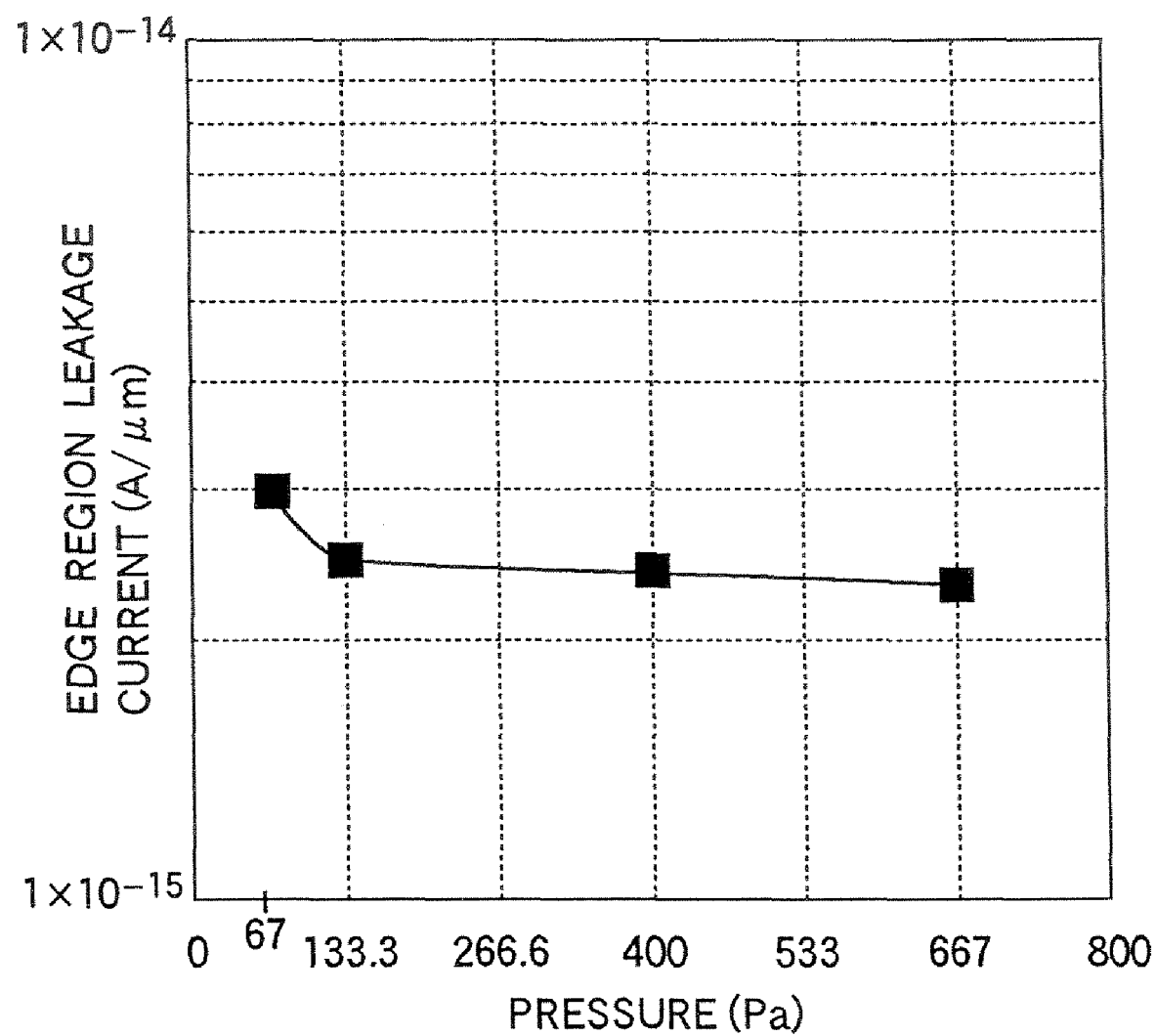
FIG. 11 This is a graph showing the influence of the oxidation pressure on the leakage current from an edge region of a polysilicon layer.

After the oxidation, a gate electrode was formed in accordance with the conventional method, and the leakage current from the edge portion 70 was measured when a voltage of −4V was applied. FIG. 11 shows the result. Note that FIG. 11 plots the process pressure on the abscissa, and the edge region leakage current value on the ordinate.

As shown in FIG. 11, the leakage current had a high value when the process pressure was 67 Pa, but remained almost constant after the process pressure exceeded 133.3 Pa. This result demonstrates that a process pressure of 133.3 Pa or more is effective to suppress the leakage current.

Then, the plasma processing apparatus 100 shown in FIG. 1 was used to perform a process by fixing the process pressure at 400 Pa (3 Torr) and changing the process temperature (substrate process temperature), and the shape of the edge portion 70 of the polysilicon layer 63 was observed. The process gas flow rates in this plasma oxidation were $Ar/O_2/H_2$=1,000/100/200 mL/min (sccm), the power supplied to the plasma was 3.4 kW, and the process time was set such that the oxide film thickness was 6 nm.

Figure 12A:
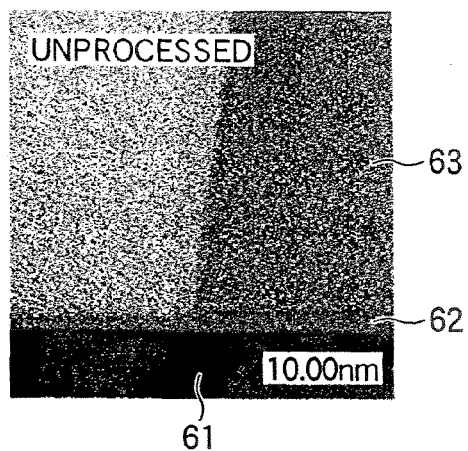
FIG. 12A This shows a TEM photograph of a polysilicon layer edge portion not having undergone a plasma oxidation process.
Figure 12B:
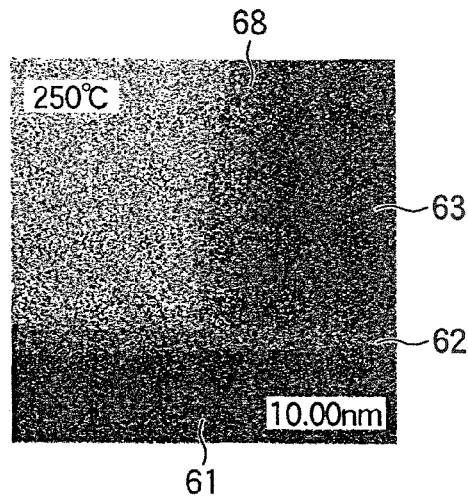
FIG. 12B This shows a TEM photograph of a polysilicon layer edge portion having undergone a plasma oxidation process at 250° C.
Figure 12C:
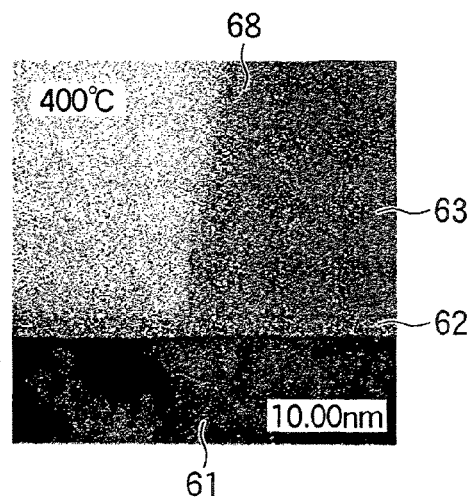
FIG. 12C This shows a TEM photograph of a polysilicon layer edge portion having undergone a plasma oxidation process at 400° C.
Figure 12D:
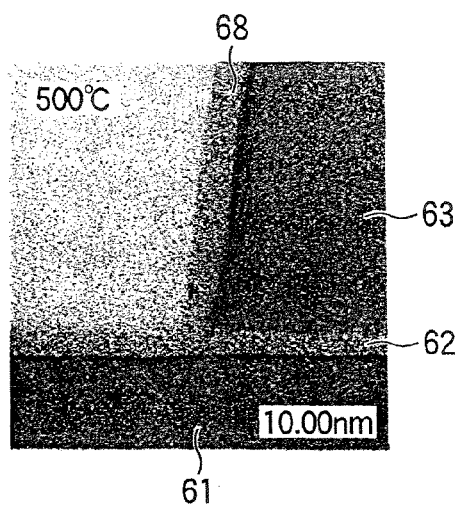
FIG. 12D This shows a TEM photograph of a polysilicon layer edge portion having undergone a plasma oxidation process at 500° C.
Figure 12E:
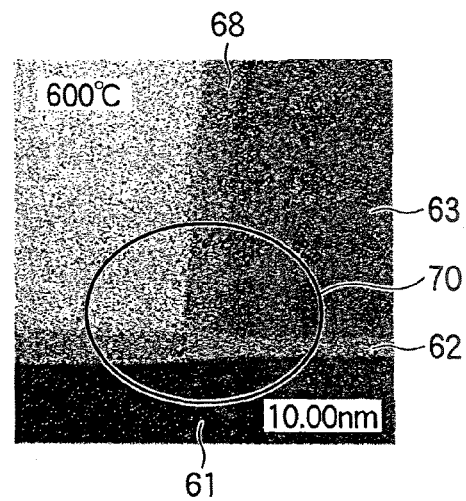
FIG. 12E This shows a TEM photograph of a polysilicon layer edge portion having undergone a plasma oxidation process at 600° C.

FIG. 12A shows a TEM photograph of the sectional structure of the gate electrode in an unprocessed state (i.e., the state before plasma oxidation), and FIGS. 12B, 12C, 12D, and 12E respectively show TEM photographs of the sectional structures of the gate electrodes when oxide films were formed by performing plasma oxidation at process temperatures of 250° C., 400° C., 500° C., and 600° C. While the shape of the edge portion 70 of the polysilicon layer 63 was acute in the unprocessed state shown in FIG. 12A, a slight bird's beak began forming on the edge portion 70 of the polysilicon layer 63 from the state shown in FIG. 12C in which the process temperature was 400° C., and a small bird's beak 72 formed on the edge portion 70 in the state shown in FIG. 12E in which the process temperature was 600° C.

Figure 13:
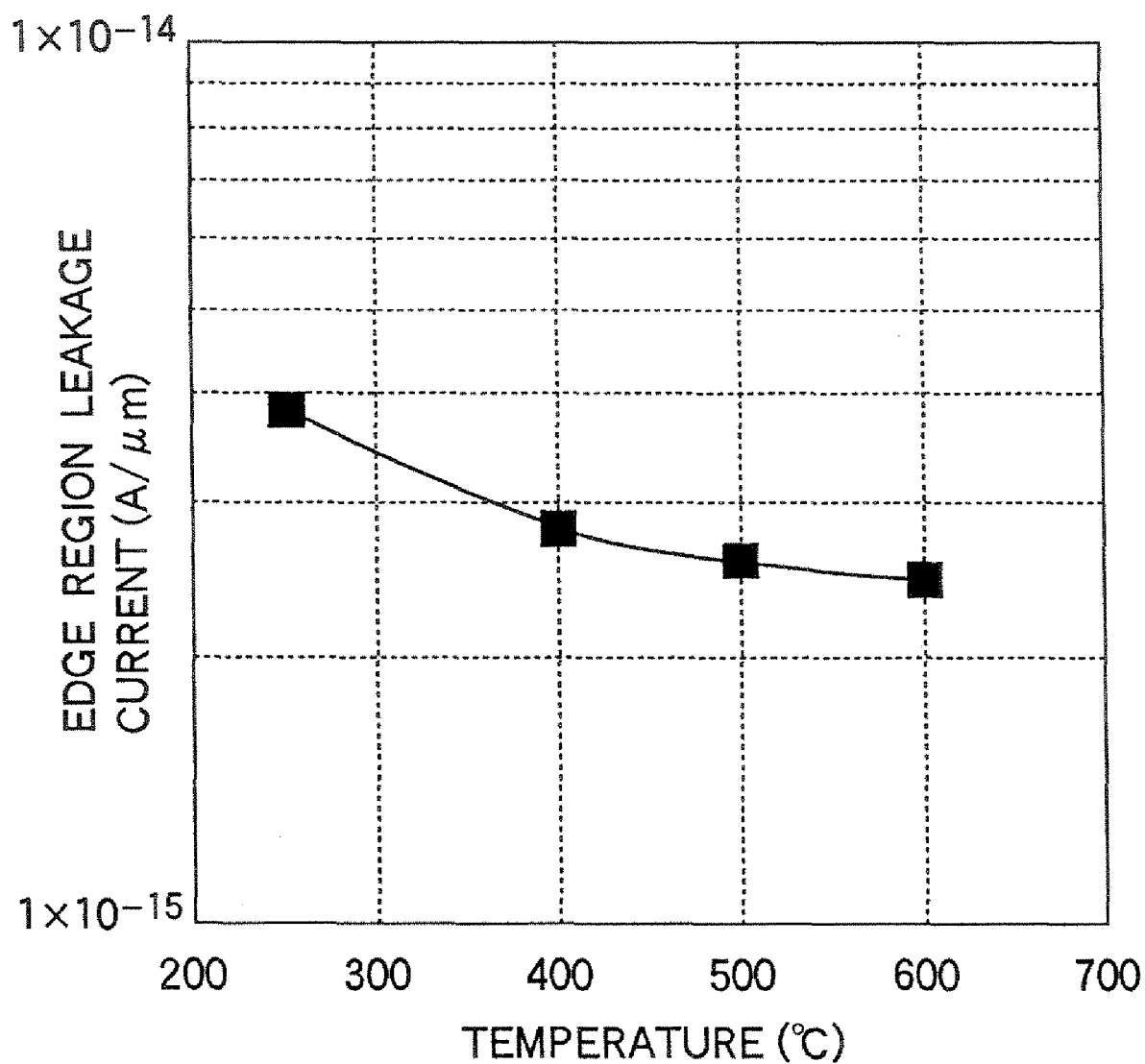
FIG. 13 This is a graph showing the influence of the oxidation temperature on the leakage current from an edge region of a polysilicon layer.

Also, after oxidation was performed at each of the above process temperatures, a gate electrode was formed in accordance with the conventional method, and the leakage current from the edge portion 70 when a voltage of −4V was applied was measured. FIG. 13 shows the result. FIG. 13 indicates that the gate leakage current reduced as the process temperature rose.

The above results demonstrate that a process pressure of 133.3 Pa or more and a process temperature of 400° C. or more are favorable from the viewpoint of bird's beak control as well, and that when the process pressure is 400 Pa or more and the process temperature is 400° C. or more, it is possible to suppress the diffusion of the active oxidizer, form an appropriate bird's beak, and reduce the gate leakage current.

It is also possible by using the plasma processing apparatus 100 shown in FIG. 1 to form an oxide film having a sufficient thickness while suppressing excess bird's beak formation, by two step processing that performs a first oxidation step of performing a plasma process on the polysilicon layer 63 at a high pressure of, e.g., 133.3 to 1,333 Pa, preferably, 400 to 700 Pa and a high temperature of 400 to 800° C., thereby forming an oxide film about, e.g., 3 to 5 nm thick on the sidewalls, and a second oxidation step of further forming an oxide film about, e.g., 10 to 15 nm on the sidewalls of the polysilicon layer 63 at a relatively low pressure of about 1.3 to 13.3 Pa and a process temperature of 250 to 800° C. In the second oxidation step of the two step processing, it is favorable to use, e.g., Ar gas, $H_2$ gas, and $O_2$ gas at flow rates of 0 to 2,000, 10 to 500, and 10 to 500 mL/min, respectively, as process gases, and the flow rate ratio ($H_2/O_2$) of $H_2$ to $O_2$ can be 1 or more, preferably, 2 or more, e.g., 2 to 8.

In the first oxidation step performed at a high pressure of this two step processing, an isotropic oxidation process is performed because the oxidation rate is relatively low, so a small bird's beak can be formed on the edge portion 70 of the polysilicon layer 63. In the second oxidation step performed at a low pressure, the oxidation rate is higher than that in the first oxidation step, and oxidation easily progresses in the direction of depth. This makes it possible to well ensure the oxide film thickness of the gate insulating film. Accordingly, by performing these two oxidation steps different in conditions together, it is possible to control the shape of the edge portion 70 of the polysilicon layer 63 and improve the uniformity of the film thickness of the gate insulating film at the same time.

Figure 14:
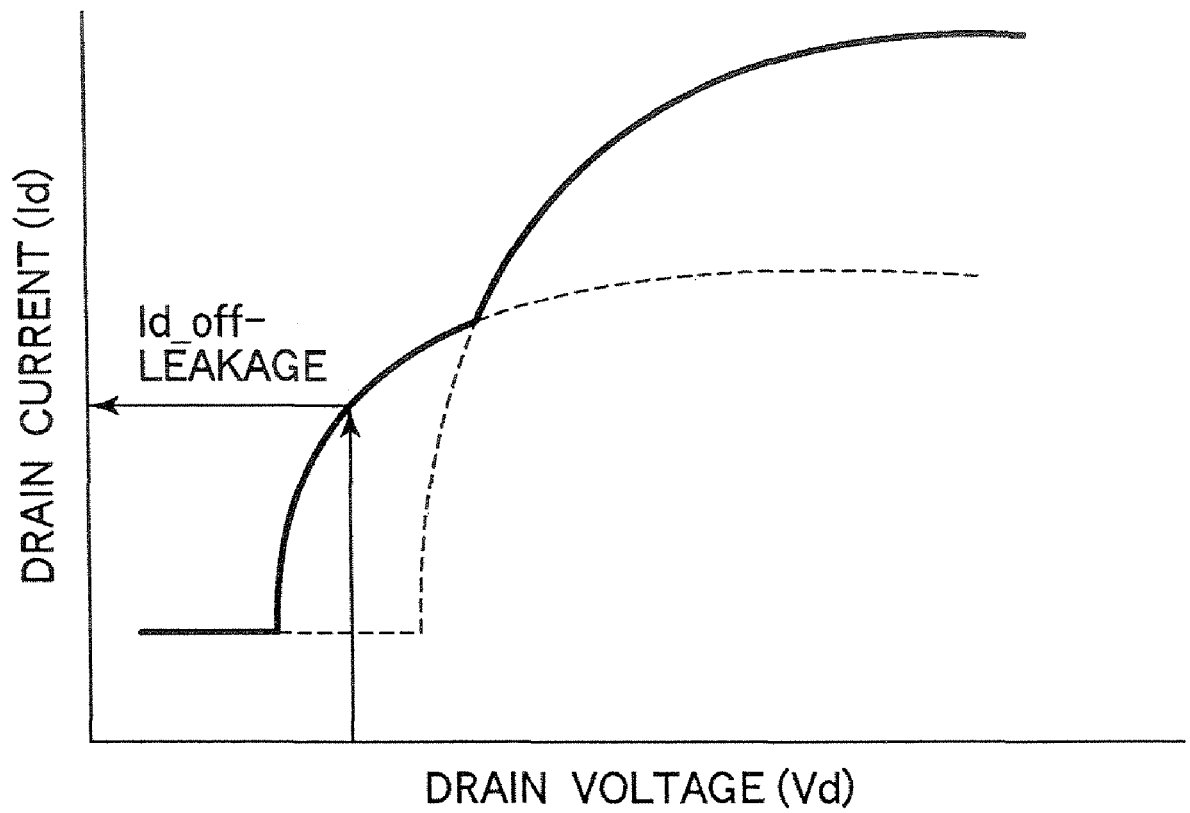
FIG. 14 This is a graph showing the drain current-voltage curve of a transistor.

Incidentally, a high voltage transistor having a gate electrode having undergone a polysilicon oxidation process performed by plasma oxidation at a low temperature of about 400° C. has the problem that an off-leakage current is produced. This phenomenon occurs even when nitrogen annealing is performed at 850° C. after the plasma oxidation process was performed at a low temperature of about 400° C. Therefore, the present inventors investigated the cause of this off-leakage current. FIG. 14 shows the drain current-voltage curve of a transistor incorporating a gate electrode having undergone a plasma oxidation process at a process temperature of 400° C. As this curve shows, a kink was produced in a low voltage region, and this kink produced the off-leakage current.

Figure 15A:
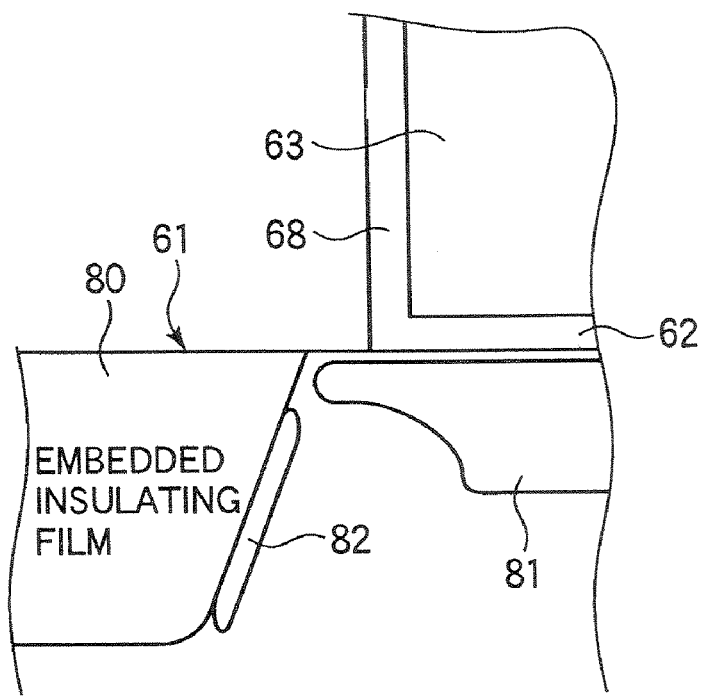
FIG. 15A This is a sectional view of the main part of a transistor in the state in which boron has been localized to the boundary portion of an embedded insulating film.
Figure 15B:
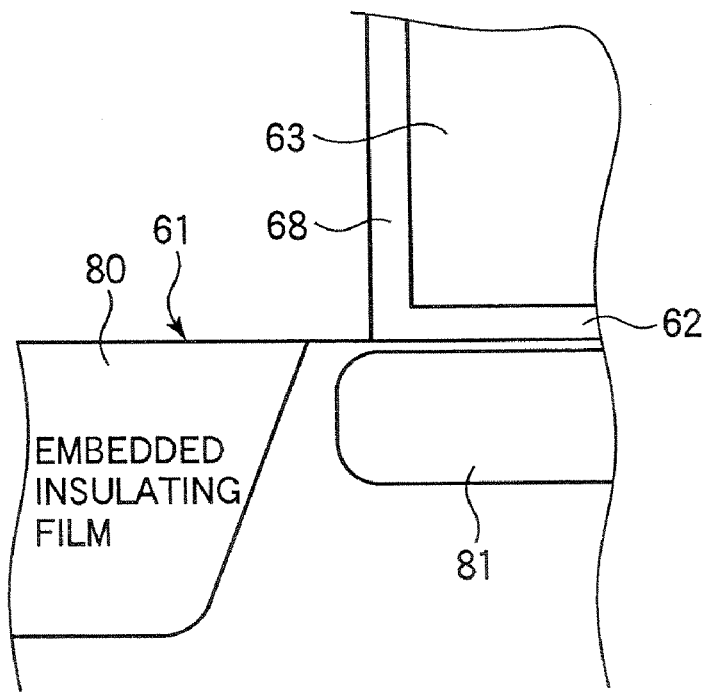
FIG. 15B This is a sectional view of the main part of a transistor in the normal state.

When the present inventors further investigated the cause of this kink, as shown in FIG. 15A, a region where boron localized along the boundary between an embedded insulating film 80 for device isolation and an impurity diffusion region 81 in a device in which the kink was produced. In the normal state, as shown in FIG. 15B, boron localized in the impurity diffusion region 81, and almost no boron existed in the boundary with the embedded insulating film 80.

This movement of boron probably decreased the boron concentration near the edge region of the gate electrode, and produced the off-leakage current. This boron localizing phenomenon perhaps occurred because boron in the impurity diffusion region 81 moved along the boundary between the embedded insulating film 80 for device isolation and the impurity diffusion region 81 when annealing applied a high temperature later in the state in which trench etching of STI (Shallow Trench Isolation) caused etching damage or the density of the embedded insulating film 80 was insufficient.

Figure 16:
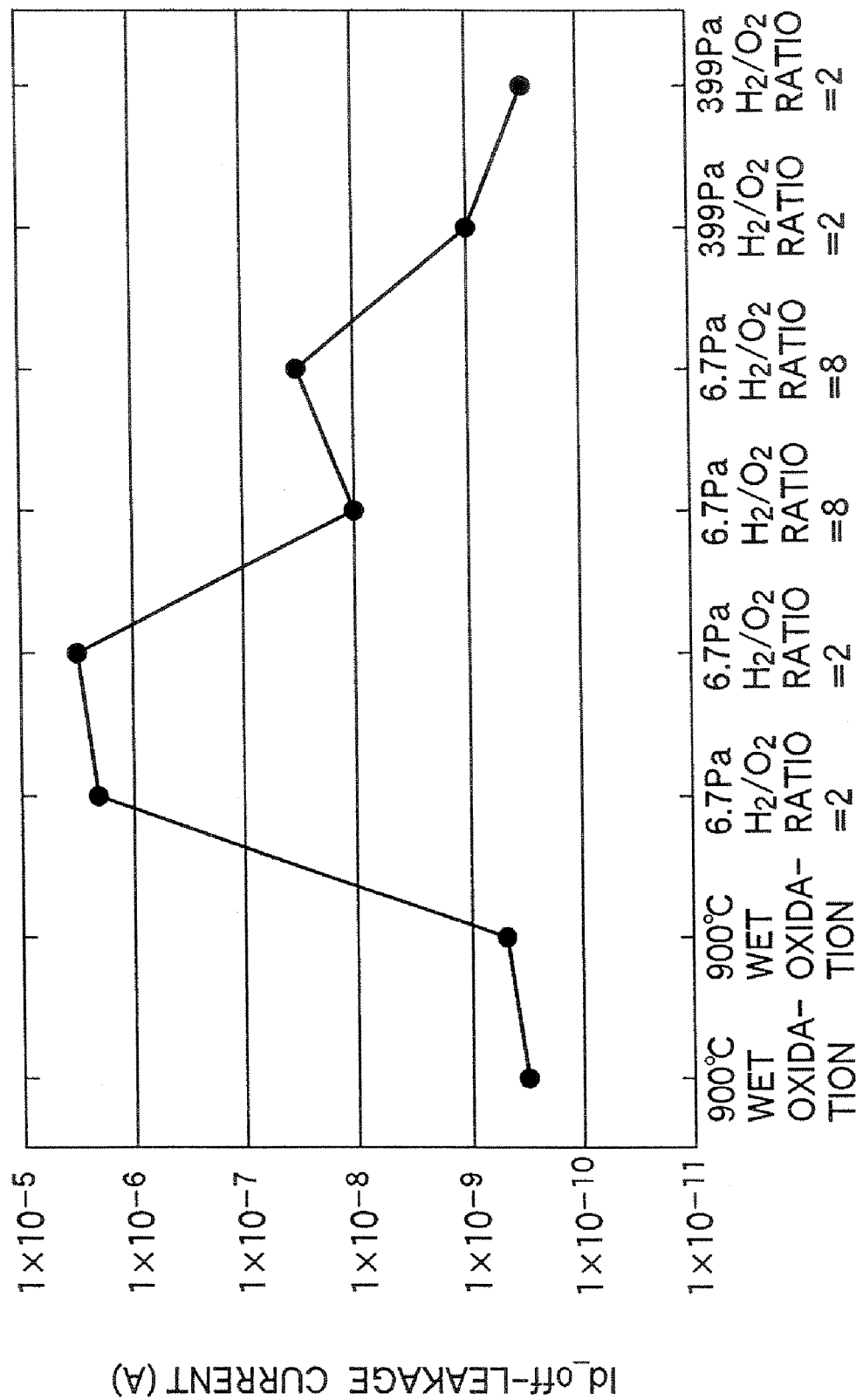
FIG. 16 This is a graph showing the measurement result of the off-leakage current of a gate electrode.

FIG. 16 is a graph showing the result of a test of measuring the off-leakage current ($Id_{off}$) of a transistor including a gate electrode obtained by forming a silicon oxide film on a polysilicon electrode by changing the plasma oxidation conditions. In this test, $Ar/O_2/H_2$ were used as process gases, the flow rate ratio $Ar/O_2/H_2$ was 1,000/100/200 mL/min (sccm) [$H_2/O_2$ ratio=2] or 1,000/50/400 mL/min (sccm) [$H_2/O_2$ ratio=8], the process pressure was 6.7 or 399 Pa, the process temperature (wafer temperature) was 400 to 800° C., the power supplied to the plasma was 3.4 kW, and the process time was 60 to 180 sec.

For comparison, FIG. 16 also shows the result of off-leakage current measurement when a wet oxidation process was performed at 900° C.

As shown in FIG. 16, when a plasma oxidation process was performed at a high pressure in a hydrogen ambient, it was possible to suppress the drain off-leakage current more effectively than when the hydrogen flow rate ratio was increased at a low pressure of 6.7 Pa. This is presumably because the plasma oxidation process suppressed the phenomenon in which boron moved along the boundary of the embedded insulating film 80 for device isolation.

As described above, it is also possible by using the plasma processing apparatus 100 shown in FIG. 1 to obtain the effect of suppressing the off-leakage current by oxidizing the polysilicon layer at a high pressure (e.g., 133.3 to 1,333 Pa) in the presence of hydrogen (e.g., hydrogen/oxygen ratio $H_2/O_2$=about 0.5 to 4).

Although the embodiment of the present invention has been described above, the present invention is not limited to the above embodiment. That is, the only purpose of the above embodiment is to clarify the technical contents of the present invention, so the present invention should not be interpreted as it is limited to a practical example like this, and can be variously modified when practiced without departing from the spirit and scope of claims of the present invention.

For example, the present invention is applicable not only to a gate electrode in which tungsten or tungsten silicide is stacked on polysilicon, but also to a gate electrode having a structure in which another refractory electrode material or its silicide is stacked. In addition, as the plasma source, it is also possible to use, e.g., an ICP (Inductively Coupled Plasma), reflected wave plasma, ECR plasma, or magnetron plasma.

Furthermore, the method of the present invention is applicable not only to the gate electrode of a transistor, but also to the manufacture of various types of semiconductor devices for which a material containing silicon must be selectively oxidized while the oxidation of a metal material is suppressed.

INDUSTRIAL APPLICABILITY

The present invention is preferably usable in the manufacture of various types of semiconductor devices such as a transistor.

The invention claimed is:

1. A semiconductor device manufacturing method comprising:
    forming a gate insulating film on a semiconductor substrate;
    forming, on the gate insulating film, a multilayered structure including at least a polysilicon layer and a metal layer containing a refractory metal;
    forming a gate electrode by etching the multilayered structure;
    performing first oxidation by performing a plasma process on the gate electrode by a plasma processing apparatus, which is configured to supply microwaves into a process chamber from a planar antenna including a plurality of slots and thereby to generate plasma, at a process pressure of 133.3 to 1,333 Pa and a process temperature of 400 to 800° C. by using a process gas containing at least hydrogen gas and oxygen gas; and
    performing second oxidation by performing a plasma process on the gate electrode by the plasma processing apparatus at a process pressure of 1.3 to 13.3 Pa and a process temperature of 250 to 800° C. by using a process gas containing at least hydrogen gas and oxygen gas.

2. The semiconductor device manufacturing method according to claim 1, wherein in the first oxidation and the second oxidation, the process is performed while flow rates of the hydrogen gas, the oxygen gas, and a rare gas in the process gas are respectively 10 to 500, 10 to 500, and 0 to 2,000 ml/min.

3. The semiconductor device manufacturing method according to claim 1, wherein
    in the first oxidation, an oxide film is formed by oxidizing a sidewall of the polysilicon layer, and an oxide film thickness on an edge portion of the polysilicon layer is increased, and
    in the second oxidation, a film thickness of the oxide film on the sidewall of the polysilicon layer is further increased.

4. The semiconductor device manufacturing method according to claim 3, wherein the film thickness of the oxide film formed in the first oxidation is 3 to 5 nm, and the film thickness of the oxide film formed in the second oxidation is 10 to 15 nm.

5. A plasma oxidation method of selectively oxidizing, by plasma, a silicon layer mainly containing silicon in a target object from which at least the silicon layer and a metal layer containing a refractory metal are exposed,
    the plasma oxidation method comprising:
    performing first oxidation by performing a plasma process on the target object by a plasma processing apparatus, which is configured to supply electromagnetic waves into a process chamber from an antenna and thereby to generate plasma, at a process pressure of 133.3 to 1,333 Pa and a process temperature of 400 to 800° C. by using a process gas containing at least hydrogen gas and oxygen gas; and
    performing second oxidation by performing a plasma process on the target object by the plasma processing apparatus at a process pressure of 1.3 to 13.3 Pa and a process temperature of 250 to 800° C. by using a process gas containing at least hydrogen gas and oxygen gas.

6. The plasma oxidation method according to claim 5, wherein the silicon layer is made of one of polysilicon, amorphous silicon, and conductor doped silicon.

7. The plasma oxidation method according to claim 5, wherein in the first oxidation and the second oxidation, the process is performed while flow rates of the hydrogen gas, the oxygen gas, and a rare gas in the process gas are respectively 10 to 500, 10 to 500, and 0 to 2,000 ml/min.

8. The plasma oxidation method according to claim 5, wherein
    in the first oxidation, an oxide film is formed by oxidizing a sidewall of a polysilicon layer, and an oxide film thickness on an edge portion of the polysilicon layer is increased, and
    in the second oxidation, a film thickness of the oxide film on the sidewall of the polysilicon layer is further increased.

9. The plasma oxidation method according to claim 8, wherein the film thickness of the oxide film formed in the first oxidation is 3 to 5 nm, and the film thickness of the oxide film formed in the second oxidation is 10 to 15 nm.

10. The plasma oxidation method according to claim 5, wherein the metal layer is one of a tungsten layer and a tungsten silicide layer.

* * * * *